(12) United States Patent
Masuda

(10) Patent No.: US 11,942,517 B2
(45) Date of Patent: Mar. 26, 2024

(54) SILICON CARBIDE SEMICONDUCTOR DEVICE AND METHOD OF MANUFACTURING SILICON CARBIDE SEMICONDUCTOR DEVICE

(71) Applicant: SUMITOMO ELECTRIC INDUSTRIES, LTD., Osaka (JP)

(72) Inventor: Takeyoshi Masuda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 306 days.

(21) Appl. No.: 17/616,585

(22) PCT Filed: May 13, 2020

(86) PCT No.: PCT/JP2020/019061
§ 371 (c)(1),
(2) Date: Dec. 3, 2021

(87) PCT Pub. No.: WO2020/250612
PCT Pub. Date: Dec. 17, 2020

(65) Prior Publication Data
US 2022/0246730 A1 Aug. 4, 2022

(30) Foreign Application Priority Data
Jun. 10, 2019 (JP) .................. 2019-107907

(51) Int. Cl.
*H01L 21/00* (2006.01)
*H01L 21/02* (2006.01)
*H01L 29/16* (2006.01)

(52) U.S. Cl.
CPC .... *H01L 29/1608* (2013.01); *H01L 21/02378* (2013.01); *H01L 21/02598* (2013.01)

(58) Field of Classification Search
CPC ........... H01L 29/1608; H01L 21/02378; H01L 21/02598
See application file for complete search history.

(56) References Cited

U.S. PATENT DOCUMENTS

2014/0302657 A1 10/2014 Lin
2016/0284746 A1 9/2016 Fukase
(Continued)

FOREIGN PATENT DOCUMENTS

JP 3-105947 A 5/1991
JP 2007-220711 A 8/2007
(Continued)

*Primary Examiner* — Richard A Booth
(74) *Attorney, Agent, or Firm* — Renner, Otto, Boisselle & Sklar, LLP

(57) ABSTRACT

A silicon carbide semiconductor device has a silicon carbide substrate, a first insulator, a first electrode, and a second electrode. The silicon carbide substrate includes a first impurity region, a second impurity region, a third impurity region, a first superjunction portion, a fourth impurity region, a fifth impurity region, a sixth impurity region, and a second superjunction portion. The first superjunction portion has a first region and a second region. The second superjunction portion has a third region and a fourth region. In a direction perpendicular to a second main surface, a bottom surface of a first trench is located between a second end surface and the second main surface and is located between a fourth end surface and the second main surface.

14 Claims, 17 Drawing Sheets

(56) References Cited

U.S. PATENT DOCUMENTS

| | | |
|---|---|---|
| 2019/0131448 A1 | 5/2019 | Yoshida |
| 2020/0058760 A1* | 2/2020 | Joshi .................. H01L 29/1095 |
| 2020/0235203 A1 | 7/2020 | Furuhashi |
| 2021/0183995 A1* | 6/2021 | Kobayashi .............. H01L 29/32 |
| 2022/0285489 A1* | 9/2022 | Takenaka ............ H01L 29/0623 |

FOREIGN PATENT DOCUMENTS

| | | |
|---|---|---|
| JP | 2008-135522 A | 6/2008 |
| JP | 2016-187007 A | 10/2016 |
| JP | 2019-083249 A | 5/2019 |
| WO | 2019/069416 A1 | 4/2019 |

\* cited by examiner

SILICON CARBIDE SEMICONDUCTOR DEVICE AND METHOD OF MANUFACTURING SILICON CARBIDE SEMICONDUCTOR DEVICE

TECHNICAL FIELD

The present disclosure relates to a silicon carbide semiconductor device and a method of manufacturing the silicon carbide semiconductor device. The present application claims a priority based on Japanese Patent Application No. 2019-107907 filed on Jun. 10, 2019, the entire content of which is incorporated herein by reference.

BACKGROUND ART

WO 2019/069416 (PTL 1) describes a MOSFET (Metal Oxide Semiconductor Field Effect Transistor) having a superjunction portion.

CITATION LIST

Patent Literature

PTL 1: WO 2019/069416

SUMMARY OF INVENTION

A silicon carbide semiconductor device according to the present disclosure includes a silicon carbide substrate, a first insulator, a first electrode, and a second electrode. The silicon carbide substrate has a first main surface and a second main surface opposite to the first main surface. The silicon carbide substrate includes: a first impurity region located between the first main surface and the second main surface, the first impurity region having a first conductivity type; a second impurity region located between the first main surface and the second main surface, the second impurity region being provided in contact with the first impurity region, the second impurity region having a second conductivity type different from the first conductivity type; a third impurity region located between the first main surface and the second main surface, the third impurity region being provided in contact with the second impurity region so as to be separated from the first impurity region, the third impurity region having the first conductivity type; a first superjunction portion having a first region and a second region, the first region being in contact with the first impurity region, the first region being located between the first impurity region and the second main surface, the first region having the first conductivity type, the second region being in contact with each of the second impurity region and the first region, the second region having the second conductivity type; a fourth impurity region located between the first main surface and the second main surface, the fourth impurity region having the first conductivity type; a fifth impurity region located between the first main surface and the second main surface, the fifth impurity region being provided in contact with the fourth impurity region, the fifth impurity region having the second conductivity type; a sixth impurity region located between the first main surface and the second main surface, the sixth impurity region being provided in contact with the fifth impurity region so as to be separated from the fourth impurity region, the sixth impurity region having the first conductivity type; and a second superjunction portion having a third region and a fourth region, the third region being in contact with the fourth impurity region, the third region being located between the fourth impurity region and the second main surface, the third region having the first conductivity type, the fourth region being in contact with each of the fifth impurity region and the third region, the fourth region having the second conductivity type. The second region has a first end surface in contact with the second impurity region, and a second end surface opposite to the first end surface. The fourth region has a third end surface in contact with the fifth impurity region, and a fourth end surface opposite to the third end surface. The first region, the second region, the fourth region, and the third region are provided side by side in a first direction parallel to the second main surface. The second region is located between the first region and the fourth region, and the fourth region is located between the second region and the third region. The first main surface is provided with a first trench that separates the second region and the fourth region from each other. A first insulator is provided inside the first trench. A bottom surface of the first trench is located between the second end surface and the second main surface and is located between the fourth end surface and the second main surface in a direction perpendicular to the second main surface.

A method of manufacturing a silicon carbide semiconductor device according to the present disclosure includes the following steps. A silicon carbide epitaxial substrate including a silicon carbide single crystal substrate and a silicon carbide epitaxial layer is prepared, the silicon carbide epitaxial layer being provided on the silicon carbide single crystal substrate, the silicon carbide epitaxial layer having impurity ions capable of imparting a first conductivity type. A trench is formed in the silicon carbide epitaxial layer, the trench having a first side surface and a second side surface opposite to the first side surface. A second region is formed by obliquely implanting, into the first side surface, impurity ions capable of imparting a second conductivity type. A fourth region is formed by obliquely implanting, into the second side surface, the impurity ions capable of imparting the second conductivity type. The silicon carbide epitaxial layer includes a first superjunction portion and a second superjunction portion, the first superjunction portion having a first region and the second region, the first region having the first conductivity type, the first region being in contact with the second region, the second superjunction portion having a third region and the fourth region, the third region having the first conductivity type, the third region being in contact with the fourth region. A bottom surface of the trench is located between the silicon carbide single crystal substrate and each of the second region and the fourth region in a direction perpendicular to a boundary surface between the silicon carbide single crystal substrate and the silicon carbide epitaxial layer. The trench is filled with an insulator.

DETAILED DESCRIPTION

Figure 1:
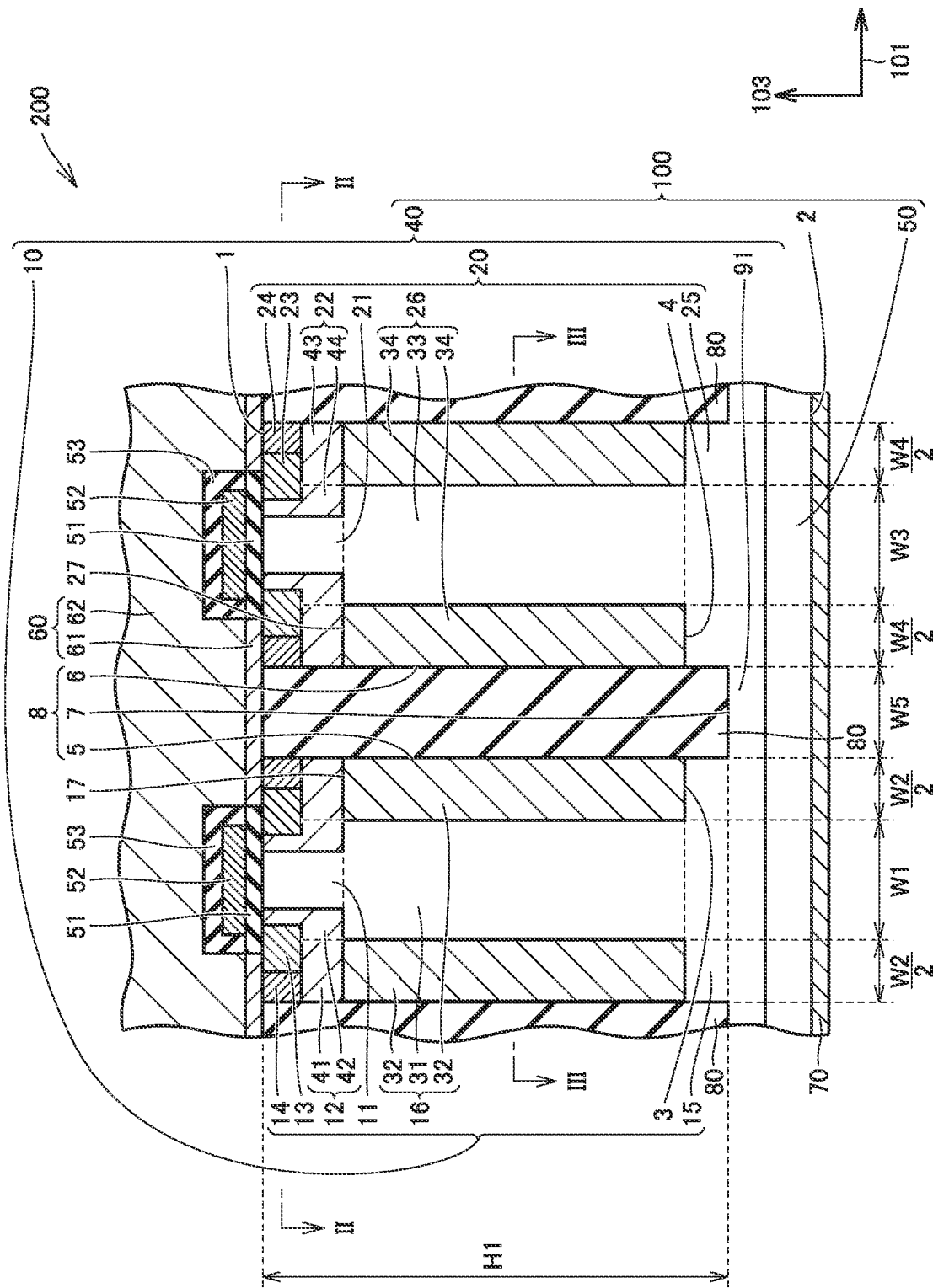
FIG. 1 is a schematic cross sectional view showing a configuration of a silicon carbide semiconductor device according to a first embodiment.

Problem to be Solved by the Present Disclosure

It is an object of the present disclosure to provide: a silicon carbide semiconductor device in which a charge balance in a superjunction portion can be maintained excellently; and a method of manufacturing such a silicon carbide semiconductor device.

Advantageous Effect of the Present Disclosure

According to the present disclosure, there can be provided: a silicon carbide semiconductor device in which a charge balance in a superjunction portion can be maintained excellently; and a method of manufacturing such a silicon carbide semiconductor device.

DESCRIPTION OF EMBODIMENTS

First, embodiments of the present disclosure are listed and described. Regarding crystallographic indications in the present specification, an individual orientation is represented by [ ], a group orientation is represented by < >, and an individual plane is represented by ( ) and a group plane is represented by { }. A crystallographically negative index is normally expressed by putting "-" (bar) above a numeral; however, in the present specification, the crystallographically negative index is expressed by putting a negative sign before the numeral.

(1) A silicon carbide semiconductor device 200 according to the present disclosure includes a silicon carbide substrate 100, a first insulator 80, a first electrode 60, and a second electrode 70. Silicon carbide substrate 100 has a first main surface 1 and a second main surface 2 opposite to first main surface 1. Silicon carbide substrate 100 includes: a first impurity region 11 located between first main surface 1 and second main surface 2, first impurity region 11 having a first conductivity type; a second impurity region 12 located between first main surface 1 and second main surface 2, second impurity region 12 being provided in contact with first impurity region 11, second impurity region 12 having a second conductivity type different from the first conductivity type; a third impurity region 13 located between first main surface 1 and second main surface 2, third impurity region 13 being provided in contact with second impurity region 12 so as to be separated from first impurity region 11, third impurity region 13 having the first conductivity type; a first superjunction portion 16 having a first region 31 and a second region 32, first region 31 being in contact with first impurity region 11, first region 31 being located between first impurity region 11 and second main surface 2, first region 31 having the first conductivity type, second region 32 being in contact with each of second impurity region 12 and first region 31, second region 32 having the second conductivity type; a fourth impurity region 21 located between first main surface 1 and second main surface 2, fourth impurity region 21 having the first conductivity type; a fifth impurity region 22 located between first main surface 1 and second main surface 2, fifth impurity region 22 being provided in contact with fourth impurity region 21, fifth impurity region 22 having the second conductivity type; a sixth impurity region 23 located between first main surface 1 and second main surface 2, sixth impurity region 23 being provided in contact with fifth impurity region 22 so as to be separated from fourth impurity region 21, sixth impurity region 23 having the first conductivity type; and a second superjunction portion 26 having a third region 33 and a fourth region 34, third region 33 being in contact with fourth impurity region 21, third region 33 being located between fourth impurity region 21 and second main surface 2, third region 33 having the first conductivity type, fourth region 34 being in contact with each of fifth impurity region 22 and third region 33, fourth region 34 having the second conductivity type. Second region 32 has a first end surface 17 in contact with second impurity region 12, and a second end surface 3 opposite to first end surface 17. Fourth region 34 has a third end surface 27 in contact with fifth impurity region 22, and a fourth end surface 4 opposite to third end surface 27. First region 31, second region 32, fourth region 34, and third region 33 are provided side by side in a first direction 101 parallel to second main surface 2. Second region 32 is located between first region 31 and fourth region 34, and fourth region 34 is located between second region 32 and third region 33. First main surface 1 is provided with a first trench 8 that separates second region 32 and fourth region 34 from each other. A first insulator 80 is provided inside first trench 8. A bottom surface 7 of first trench 8 is located between second end surface 3 and second main surface 2 and is located between fourth end surface 4 and second main surface 2 in a direction perpendicular to second main surface 2.

(2) In silicon carbide semiconductor device 200 according to (1), an impurity concentration of each of first region 31 and third region 33 may be more than or equal to $3 \times 10^{16}$ cm$^{-3}$ and less than or equal to $3 \times 10^{17}$ cm$^{-3}$.

(3) In silicon carbide semiconductor device 200 according to (1) or (2), when it is assumed that a width of first region 31 is a first width W1 and a width of second region 32 is a second width W2 in first direction 101 and when it is assumed that an impurity concentration of first region 31 is a first concentration and an impurity concentration of second region 32 is a second concentration, a value obtained by dividing, by a value obtained by multiplying the second concentration by second width W2, a value obtained by multiplying the first concentration by first width W1 may be more than or equal to 0.5 and less than or equal to 1.5, and when it is assumed that a width of third region 33 is a third width W3 and a width of fourth region 34 is a fourth width W4 in first direction 101 and when it is assumed that an impurity concentration of third region 33 is a third concentration and an impurity concentration of fourth region 34 is a fourth concentration, a value obtained by dividing, by a value obtained by multiplying the fourth concentration by fourth width W4, a value obtained by multiplying the third concentration by third width W3 may be more than or equal to 0.5 and less than or equal to 1.5.

(4) In silicon carbide semiconductor device 200 according to (3), each of second width W2 and fourth width W4 may be more than or equal to 0.1 μm and less than or equal to 2 μm.

(5) In silicon carbide semiconductor device 200 according to any one of (1) to (4), a width of first trench 8 in first direction 101 may be more than or equal to 1 μm and less than or equal to 3 μm.

(6) In silicon carbide semiconductor device 200 according to any one of (1) to (5), a depth of first trench 8 may be more than or equal to 3 μm and less than or equal to 30 μm.

(7) In silicon carbide semiconductor device 200 according to any one of (1) to (6), a value obtained by dividing a depth of first trench 8 by a width of first trench 8 in first direction 101 may be more than or equal to 0.5 and less than or equal to 25.

(8) In silicon carbide semiconductor device 200 according to any one of (1) to (7), first trench 8 may have a first side surface 5 and a second side surface 6, first side surface 5 being in contact with second region 32, first side surface 5 being recessed from second region 32 toward first region 31, second side surface 6 being in contact with fourth region 34, second side surface 6 being recessed from fourth region 34 toward third region 33.

(9) In silicon carbide semiconductor device 200 according to (8), a value obtained by subtracting a minimum width of first region 31 from a maximum width of first region 31 in first direction 101 may be more than or equal to 0.05 μm and less than or equal to 2.0 μm, and a value obtained by subtracting a minimum width of third region 33 from a maximum width of third region 33 in first direction 101 may be more than or equal to 0.05 μm and less than or equal to 2.0 μm.

(10) In silicon carbide semiconductor device 200 according to any one of (1) to (9), first impurity region 11 and first region 31 may be in one piece and fourth impurity region 21 and third region 33 may be in one piece.

(11) In silicon carbide semiconductor device 200 according to any one of (1) to (10), first main surface 1 may be provided with a second trench 9 that surrounds first trench 8 when viewed in the direction perpendicular to second main surface 2, and silicon carbide semiconductor device 200 may further include a second insulator 90 provided inside second trench 9.

(12) A method of manufacturing a silicon carbide semiconductor device 200 according to the present disclosure includes the following steps. A silicon carbide epitaxial substrate 100 including a silicon carbide single crystal substrate 50 and a silicon carbide epitaxial layer 40 is prepared, silicon carbide epitaxial layer 40 being provided on silicon carbide single crystal substrate 50, silicon carbide epitaxial layer 40 having impurity ions capable of imparting a first conductivity type. A trench 8 is formed in silicon carbide epitaxial layer 40, trench 8 having a first side surface 5 and a second side surface 6 opposite to first side surface 5. A second region 32 is formed by obliquely implanting, into first side surface 5, impurity ions capable of imparting a second conductivity type. A fourth region 34 is formed by obliquely implanting, into second side surface 6, the impurity ions capable of imparting the second conductivity type. Silicon carbide epitaxial layer 40 includes a first superjunction portion 16 and a second superjunction portion 26, first superjunction portion 16 having a first region 31 and second region 32, first region 31 having the first conductivity type, first region 31 being in contact with second region 32, second superjunction portion 26 having a third region 33 and fourth region 34, third region 33 having the first conductivity type, third region 33 being in contact with fourth region 34. A bottom surface 7 of trench 8 is located between silicon carbide single crystal substrate 50 and each of second region 32 and fourth region 34 in a direction perpendicular to a boundary surface 45 between silicon carbide single crystal substrate 50 and silicon carbide epitaxial layer 40. Trench 8 is filled with an insulator 80.

(13) In method of manufacturing silicon carbide semiconductor device 200 according to (12), in each of the forming of second region 32 and the forming of fourth region 34, the impurity ions capable of imparting the second conductivity type may be implanted into bottom surface 7. The impurity ions capable of imparting the second conductivity type and implanted in bottom surface 7 may be removed by etching.

(14) In method of manufacturing a silicon carbide semiconductor device 200 according to (12), in each of the forming of second region 32 and the forming of fourth region 34, oblique implantation is performed to avoid the impurity ions capable of imparting the second conductivity type from being implanted into bottom surface 7.

DETAILED DESCRIPTION OF THE INVENTION

Hereinafter, embodiments of the present disclosure will be described in detail. In the description below, the same or corresponding elements are denoted by the same reference numerals, and will not be described repeatedly.

First Embodiment

First, a configuration of a silicon carbide semiconductor device 200 according to a first embodiment will be described. FIG. 1 is a schematic cross sectional view showing the configuration of silicon carbide semiconductor device 200 according to the first embodiment.

As shown in FIG. 1, silicon carbide semiconductor device 200 according to the first embodiment is, for example, a planar type MOSFET, and mainly includes a silicon carbide substrate 100, gate electrodes 52, gate insulating films 51, separation insulating films 53, a first electrode 60, a second electrode 70, and first insulators 80. Silicon carbide substrate 100 has a first main surface 1 and a second main surface 2 opposite to first main surface 1. Silicon carbide substrate 100 includes a silicon carbide single crystal substrate 50 and a silicon carbide epitaxial layer 40 provided on silicon carbide single crystal substrate 50. Silicon carbide single crystal substrate 50 forms second main surface 2. Silicon carbide epitaxial layer 40 forms first main surface 1.

Silicon carbide single crystal substrate 50 is composed of, for example, hexagonal silicon carbide having a polytype of 4H. First main surface 1 corresponds to, for example, a {0001} plane or a plane angled off by less than or equal to 8° with respect to the {0001} plane. Specifically, first main surface 1 corresponds to, for example, a (0001) plane or a plane angled off by less than or equal to 8° with respect to the (0001) plane. First main surface 1 may correspond to, for example, a (000-1) plane or a plane angled off by less than or equal to 8° with respect to the (000-1) plane.

Silicon carbide substrate 100 includes a first impurity region 11, second impurity regions 12, third impurity regions 13, first contact regions 14, and a first superjunction portion 16. First impurity region 11 includes an n type impurity capable of imparting the n type, such as N (nitrogen). First impurity region 11 has, for example, the n type (first conductivity type). First impurity region 11 is, for example, a drift region. Second impurity regions 12 are provided in contact with first impurity region 11. First impurity region 11 is located between first main surface 1 and second main surface 2.

Each of second impurity regions 12 includes a p type impurity capable of imparting the p type, such as Al (aluminum). Second impurity region 12 has p type (second conductivity type) different from the n type. Second impurity region 12 is, for example, a body region. The concentration of the p type impurity included in second impurity region 12 may be higher than the concentration of the n type impurity included in first impurity region 11. Second impurity region 12 is located between first main surface 1 and second main surface 2.

Second impurity region 12 may have a fifth region 41 and a sixth region 42. The concentration of the p type impurity included in fifth region 41 may be higher than the concentration of the p type impurity included in sixth region 42. Fifth region 41 is in contact with second region 32, third impurity region 13, and first contact region 14. Sixth region 42 is in contact with first region 31, third impurity region 13, and first impurity region 11.

Third impurity regions 13 are provided in contact with second impurity regions 12 so as to be separated from first impurity region 11. Each of third impurity regions 13 includes an n type impurity capable of imparting the n type, such as P (phosphorus). Third impurity region 13 has, for example, the n type. Third impurity region 13 is, for example, a source region. Third impurity region 13 is located between first main surface 1 and second main surface 2. The concentration of the n type impurity included in third impurity region 13 may be higher than the concentration of the p type impurity included in second impurity region 12. Each of first contact regions 14 includes a p type impurity capable of imparting the p type, such as Al. First contact region 14 has the p type. The concentration of the p type impurity included in first contact region 14 may be higher than the concentration of the p type impurity included in second impurity region 12.

First superjunction portion 16 has a first region 31 and second regions 32. First region 31 is in contact with first impurity region 11. First region 31 is located between first impurity region 11 and second main surface 2. First region 31 includes an n type impurity capable of imparting the n type, such as N. First region 31 has, for example, the n type. First region 31 may be in contact with second impurity regions 12.

Second regions 32 are in contact with second impurity regions 12 and first region 31. Each of second regions 32 includes a p type impurity capable of imparting the p type, such as Al. Second region 32 has, for example, the p type. First region 31 is interposed between the pair of second regions 32, for example. First region 31 and second regions 32 form first superjunction portion 16. As shown in FIG. 1, when viewed in a direction (second direction 102) perpendicular to each of a first direction 101 and a third direction 103, each of first region 31 and second regions 32 has a columnar shape.

Silicon carbide substrate 100 includes a fourth impurity region 21, fifth impurity regions 22, sixth impurity regions 23, second contact regions 24, and a second superjunction portion 26. Fourth impurity region 21 includes an n type impurity capable of imparting the n type, such as N. Fourth impurity region 21 has, for example, the n type (first conductivity type). Fourth impurity region 21 is, for example, a drift region. Fourth impurity region 21 is located between first main surface 1 and second main surface 2.

Fifth impurity regions 22 are provided in contact with fourth impurity region 21. Each of fifth impurity region 22 includes a p type impurity capable of imparting the p type, such as Al. Fifth impurity region 22 has the p type (second conductivity type) different from the n type. Fifth impurity region 22 is, for example, a body region. The concentration of the p type impurity included in fifth impurity region 22 may be higher than the concentration of the n type impurity included in fourth impurity region 21. Fifth impurity region 22 is located between first main surface 1 and second main surface 2.

Fifth impurity region 22 may have a seventh region 43 and an eighth region 44. The concentration of the p type impurity included in seventh region 43 may be higher than the concentration of the p type impurity included in eighth region 44. Seventh region 43 is in contact with fourth region 34, sixth impurity region 23, and second contact region 24. Eighth region 44 is in contact with third region 33, sixth impurity region 23, and fourth impurity region 21.

Sixth impurity regions 23 are provided in contact with fifth impurity regions 22 so as to be separated from fourth impurity region 21. Each of sixth impurity regions 23 includes an n type impurity capable of imparting the n type, such as P (phosphorus). Sixth impurity region 23 has, for example, the n type. Sixth impurity region 23 is, for example, a source region. Sixth impurity region 23 is located between first main surface 1 and second main surface 2. The concentration of the n type impurity included in sixth impurity region 23 may be higher than the concentration of the p type impurity included in fifth impurity region 22. Each of second contact regions 24 includes a p type impurity capable of imparting the p type, such as Al. Second contact region 24 has the p type. The concentration of the p type impurity included in second contact region 24 may be higher than the concentration of the p type impurity included in fifth impurity region 22.

Second superjunction portion 26 has a third region 33 and fourth regions 34. Third region 33 is in contact with fourth impurity region 21. Third region 33 is located between fourth impurity region 21 and second main surface 2. Third region 33 includes an n type impurity capable of imparting the n type, such as N. Third region 33 has, for example, the n type. Third region 33 may be in contact with fifth impurity region 22.

Fourth regions 34 are in contact with fifth impurity regions 22 and third region 33. Each of fourth regions 34 includes a p type impurity capable of imparting the p type, such as Al. Fourth region 34 has, for example, the p type. Third region 33 is interposed between fourth regions 34, for example. Third region 33 and fourth regions 34 form second superjunction portion 26. As shown in FIG. 1, when viewed in the direction (second direction 102) perpendicular to each of first direction 101 and third direction 103, each of third region 33 and fourth regions 34 has a columnar shape. First superjunction portion 16 and second superjunction portion 26 are alternately disposed in the direction (first direction 101) from third region 33 toward fourth region 34.

As shown in FIG. 1, in the direction (first direction 101) from first region 31 toward second region 32, the width of first region 31 is a first width W1, and the width of second region 32 is a second width W2. In the direction (first direction 101) from third region 33 toward fourth region 34, the width of third region 33 is a third width W3, and the width of fourth region 34 is a fourth width W4. It should be noted that when second region 32 is separated into two regions as shown in FIG. 1, the width of second region 32 refers to the total of the widths of these two second regions 32. Similarly, when fourth region 34 is separated into two regions, the width of fourth region 34 refers to the total of the widths of these two fourth regions 34.

Each of second width W2 and fourth width W4 is, for example, more than or equal to 0.3 μm and less than or equal to 0.5 μm. The upper limit of each of second width W2 and fourth width W4 is not particularly limited, but may be less than or equal to 1 μm or may be less than or equal to 2 μm, for example. The lower limit of each of second width W2 and fourth width W4 is not particularly limited, but may be more than or equal to 0.2 μm or may be more than or equal to 0.1 μm, for example.

The impurity concentration of each of first region 31 and third region 33 is, for example, more than or equal to $3 \times 10^{16}$ cm$^{-3}$ and less than or equal to $3 \times 10^{17}$ cm$^{-3}$. The upper limit of the impurity concentration of each of first region 31 and third region 33 is not particularly limited, but may be less than or equal to $5 \times 10^{17}$ cm$^{-3}$ or may be less than or equal to $1 \times 10^{18}$ cm$^{-3}$, for example. The lower limit of the impurity concentration of each of first region 31 and third region 33 is not particularly limited, but may be more than or equal to $2 \times 10^{16}$ cm$^{-3}$ or may be more than or equal to $1 \times 10^{16}$ cm$^{-3}$, for example.

When it is assumed that the impurity concentration of first region 31 is a first concentration and the impurity concentration of second region 32 is a second concentration, a value (first ratio) obtained by dividing, by a value obtained by multiplying the second concentration by second width W2, a value obtained by multiplying the first concentration by first width W1 is more than or equal to 0.7 and less than or equal to 1.3. The upper limit of the first ratio is not particularly limited, but may be less than or equal to 1.4 or may be less than or equal to 1.5, for example. The lower limit of the first ratio is not particularly limited, but may be more than or equal to 0.6 or more than or equal to 0.5, for example.

When it is assumed that the impurity concentration of third region 33 is a third concentration and the impurity concentration of fourth region 34 is a fourth concentration, a value (second ratio) obtained by dividing, by a value obtained by multiplying the fourth concentration by fourth width W4, a value obtained by multiplying the third concentration by third width W3 is more than or equal to 0.7 and less than or equal to 1.3. The upper limit of the second ratio is not particularly limited, but may be less than or equal to 1.4 or may be less than or equal to 1.5, for example. The lower limit of the second ratio is not particularly limited, but may be more than or equal to 0.6 or may be more than or equal to 0.5, for example.

Silicon carbide substrate 100 includes a first lower drift region 15, a second lower drift region 25, and a third lower drift region 91. First lower drift region 15 includes an n type impurity capable of imparting the n type, such as N. First lower drift region 15 has the n type. First lower drift region 15 is in contact with each of first region 31 and second regions 32. First lower drift region 15 is located between second main surface 2 and each of first region 31 and second regions 32. Second lower drift region 25 has the n type. Second lower drift region 25 is in contact with each of third region 33 and fourth regions 34. Second lower drift region 25 is located between second main surface 2 and each of third region 33 and fourth regions 34.

Third lower drift region 91 includes an n type impurity capable of imparting the n type, such as N. Third lower drift region 91 has the n type. Third lower drift region 91 is located between first lower drift region 15 and second lower drift region 25. Third lower drift region 91 is contiguous to each of first lower drift region 15 and second lower drift region 25. First lower drift region 15 is electrically connected to second lower drift region 25 via third lower drift region 91.

As shown in FIG. 1, first region 31, second region 32, fourth region 34, and third region 33 are provided side by side in first direction 101 parallel to second main surface 2. Second region 32 is located between first region 31 and fourth region 34, and fourth region 34 is located between second region 32 and third region 33. As shown in FIG. 1, first main surface 1 is provided with first trenches 8. Each of first trenches 8 separates second region 32 and fourth region 34 from each other. First trench 8 is located between second region 32 and fourth region 34. First trench 8 has a first side surface 5, a first bottom surface 7, and a second side surface 6. Second side surface 6 is opposite to first side surface 5. Each of first side surface 5 and second side surface 6 is contiguous to first main surface 1. First bottom surface 7 is contiguous to each of first side surface 5 and second side surface 6.

Second region 32 has a first end surface 17 and a second end surface 3. First end surface 17 is in contact with second impurity region 12. Second end surface 3 is opposite to first end surface 17. Fourth region 34 has a third end surface 27 and a fourth end surface 4. Third end surface 27 is in contact with fifth impurity region 22. Fourth end surface 4 is opposite to third end surface 27. As shown in FIG. 1, in the direction (third direction 103) perpendicular to second main surface 2, first bottom surface 7 of first trench 8 is located between second end surface 3 and second main surface 2, and is located between fourth end surface 4 and second main surface 2. From another point of view, it can be said that first bottom surface 7 of first trench 8 is located on the second main surface 2 side with respect to each of second end surface 3 and fourth end surface 4.

First contact region 14, second impurity region 12, second region 32, and first lower drift region 15 are in contact with first side surface 5. Second contact region 24, fifth impurity region 22, fourth region 34, and second lower drift region 25 are in contact with second side surface 6. Third lower drift region 91 is in contact with first bottom surface 7. Each of second region 32 and fourth region 34 is separated from first bottom surface 7.

As shown in FIG. 1, the width (fifth width W5) of first trench 8 in the direction (first direction 101) from second region 32 toward fourth region 34 is, for example, more than or equal to 1 μm and less than or equal to 3 μm. The upper limit of the width of first trench 8 is not particularly limited, but may be less than or equal to 4 μm or may be less than or equal to 5 μm, for example. The lower limit of the width of first trench 8 is not particularly limited, but may be more than or equal to 0.75 μm or may be more than or equal to 0.5 μm, for example.

As shown in FIG. 1, the depth (first depth H1) of first trench 8 in the thickness direction (third direction 103) of silicon carbide substrate 100 is, for example, more than or equal to 3 μm and less than or equal to 30 μm. The upper limit of the depth of first trench 8 is not particularly limited, but may be less than or equal to 50 μm or may be less than or equal to 100 μm, for example. The lower limit of the depth of first trench 8 is not particularly limited, but may be more than or equal to 2 μm or may be more than or equal to 1 μm, for example.

A value (aspect ratio) obtained by dividing the depth (first depth H1) of first trench 8 by the width (fifth width W5) of first trench 8 in the direction (first direction 101) from second region 32 toward fourth region 34 is, for example, more than or equal to 2 and less than or equal to 20. The upper limit of the aspect ratio is not particularly limited, but may be more than or equal to 1 or may be more than or equal to 0.5, for example. The lower limit of the aspect ratio is not particularly limited, but may be less than or equal to 25 or may be less than or equal to 50, for example.

As shown in FIG. 1, first impurity region 11 and first region 31 are preferably in one piece. First impurity region 11 and first region 31 are preferably in one piece. Specifically, in a boundary region (region of more than or equal to 3 μm) between first impurity region 11 and first region 31, a concentration distribution of the n type impurity along third direction 103 (value obtained by dividing, by an average concentration, a value obtained by subtracting the minimum concentration from the maximum concentration) is less than or equal to 10. Preferably, first impurity region 11, first region 31, and first lower drift region 15 are seamlessly connected to one another. From another point of view, it can be said that first impurity region 11, first region 31, and first lower drift region 15 are formed in one epitaxial growth step.

Similarly, fourth impurity region 21 and third region 33 are preferably in one piece. Specifically, in a boundary region (region of more than or equal to 3 μm) between fourth impurity region 21 and third region 33, a concentration distribution of the n type impurity along third direction 103 (value obtained by dividing, by an average concentration, a value obtained by subtracting the minimum concentration from the maximum concentration) is less than or equal to 10. Preferably, fourth impurity region 21, third region 33, and second lower drift region 25 are seamlessly connected to one another. From another point of view, it can be said that fourth impurity region 21, third region 33, and second lower drift region 25 are formed in one epitaxial growth step.

First insulator 80 is provided inside first trench 8. From another point of view, it can be said that first trench 8 is filled with first insulator 80. First insulator 80 is, for example, a BCB (BenzoCycloButene) resin. The BCB resin is excellent in heat resistance, chemical resistance, and filling property. First insulator 80 may be, for example, a SOG (Spin On Glass) film or a silicon dioxide film.

As shown in FIG. 1, first impurity region 11, second impurity region 12, third impurity region 13, first contact region 14, first region 31, second region 32, and first lower drift region 15 may form a first mesa region 10. Fourth impurity region 21, fifth impurity region 22, sixth impurity region 23, second contact region 24, third region 33, fourth region 34, and second lower drift region 25 may form a second mesa region 20. First mesa region 10 and second mesa region 20 are separated by first insulator 80.

Each of gate insulating films 51 is composed of, for example, silicon dioxide. Gate insulating film 51 is provided in contact with first main surface 1. The gate insulating film is in contact with each of first impurity region 11, second impurity region 12, and third impurity region 13 at first main surface 1. A channel can be formed in second impurity region 12 that is in contact with gate insulating film 51. The gate insulating film is in contact with each of fourth impurity region 21, fifth impurity region 22, and sixth impurity region 23 at first main surface 1. A channel can be formed in fifth impurity region 22 that is in contact with gate insulating film 51. The thickness of each gate insulating film 51 is, for example, more than or equal to 40 nm and less than or equal to 150 nm.

Gate electrodes 52 are provided on respective gate insulating films 51. Gate electrodes 52 are disposed in contact with respective gate insulating films 51. Each of gate electrodes 52 is composed of, for example, a conductor such as polysilicon doped with an impurity.

Separation insulating films 53 are provided to cover respective gate electrodes 52. Separation insulating films 53 are in contact with respective gate electrodes 52 and respective gate insulating films 51. Each of separation insulating films 53 is composed of, for example, a NSG (None-doped Silicate Glass) film, a PSG (Phosphorus Silicate Glass) film, or the like. Separation insulating film 53 electrically insulates gate electrode 52 and first electrode 60 from each other.

First electrode 60 is provided on first main surface 1. First electrode 60 is, for example, a source electrode. First electrode 60 is electrically connected to each of third impurity regions 13 and sixth impurity regions 23. First electrode 60 has electrode layers 61 and a source wiring 62. Each of electrode layers 61 is composed of, for example, a Ni alloy. Electrode layer 61 is composed of, for example, a material including Ti (titanium), Al (aluminum), and Si (silicon). Source wiring 62 is composed of, for example, a material including Al.

First electrode 60 may be in contact with each of third impurity regions 13 and sixth impurity regions 23 at first main surface 1. First electrode 60 may be in contact with each of first contact regions 14 and second contact regions 24 at first main surface 1. First electrode 60 extends over first trench 8. First electrode 60 may be in contact with first insulator 80.

Second electrode 70 is provided on second main surface 2. Second electrode 70 is, for example, a drain electrode. Second electrode 70 is electrically connected to each of first region 31 and third region 33. Second electrode 70 is in contact with silicon carbide single crystal substrate 50 at second main surface 2. Second electrode 70 is composed of a material capable of ohmic contact with silicon carbide single crystal substrate 50 having the n type, such as NiSi (nickel silicide).

Figure 2:
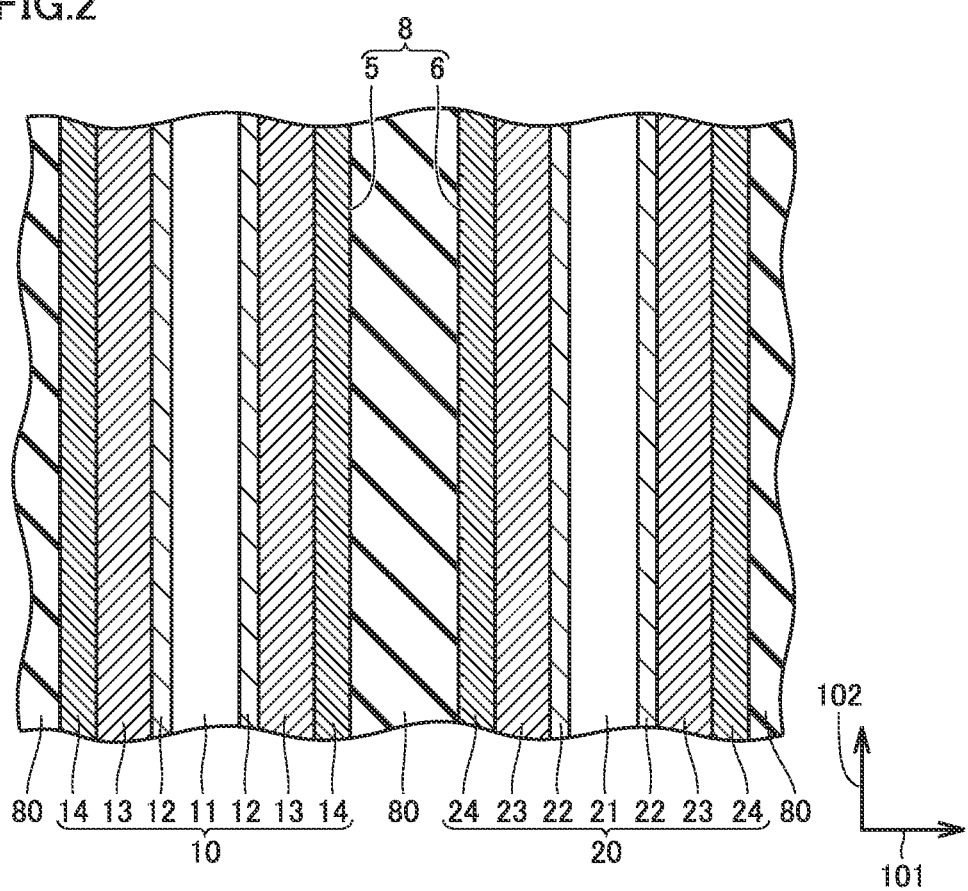
FIG. 2 is a schematic cross sectional view taken along a II-II line in FIG. 1.

FIG. 2 is a schematic cross sectional view taken along a II-II line of FIG. 1. As shown in FIG. 2, when viewed in the direction perpendicular to second main surface 2, first trench 8 extends along second direction 102. From another point of view, it can be said that the long side direction of first trench 8 is second direction 102. The short side direction of first trench 8 is first direction 101. Similarly, first insulator 80 extends along second direction 102. From another point of view, it can be said that the long side direction of first insulator 80 is second direction 102. The short side direction of first insulator 80 is first direction 101. When viewed in the direction perpendicular to second main surface 2, each of first trench 8 and first insulator 80 may have a substantially rectangular shape.

As shown in FIG. 2, each of first impurity region 11, second impurity regions 12, third impurity regions 13, first contact regions 14, fourth impurity region 21, fifth impurity regions 22, sixth impurity regions 23, and second contact regions 24 extends along second direction 102. From another point of view, it can be said that the long side direction of each of first impurity region 11, second impurity regions 12, third impurity regions 13, first contact regions 14, fourth impurity region 21, fifth impurity regions 22, sixth impurity regions 23, and second contact regions 24 is second direction 102. The short side direction of each of first impurity region 11, second impurity regions 12, third impurity regions 13, first contact regions 14, fourth impurity region 21, fifth impurity regions 22, sixth impurity regions 23, and second contact regions 24 is first direction 101.

Figure 3:
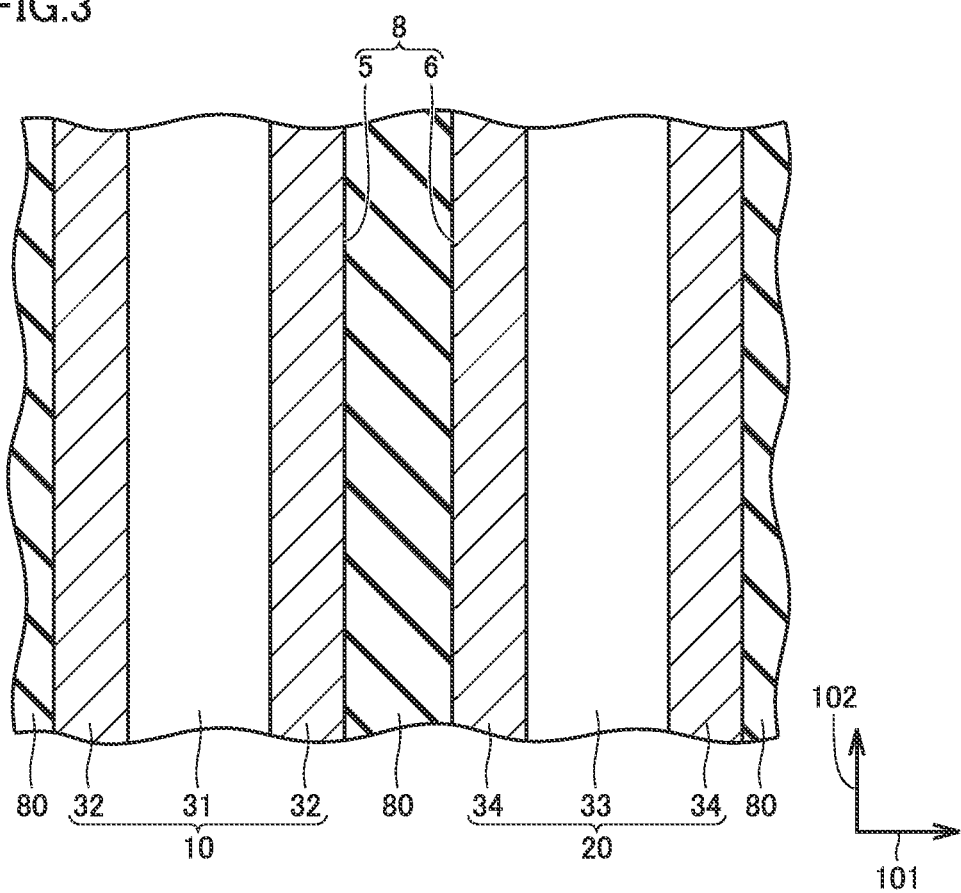
FIG. 3 is a schematic cross sectional view taken along a line in FIG. 1.

FIG. 3 is a schematic cross sectional view taken along a line in FIG. 1. As shown in FIG. 3, when viewed in the direction perpendicular to second main surface 2, each of first region 31 and second regions 32 extends along second direction 102. From another point of view, it can be said that the long side direction of each of first region 31 and second regions 32 is second direction 102. The short side direction of each of first region 31 and second regions 32 is first direction 101. In first direction 101, second regions 32 are disposed on the both sides beside first region 31.

Similarly, when viewed in the direction perpendicular to second main surface 2, each of third region 33 and fourth regions 34 extends along second direction 102. From another point of view, it can be said that the long side direction of each of third region 33 and fourth regions 34 is second direction 102. The short side direction of each of third region 33 and fourth regions 34 is first direction 101. In first direction 101, fourth regions 34 are disposed on the both sides beside third region 33.

It should be noted that in the above description, each of first direction 101 and second direction 102 is parallel to second main surface 2. Third direction 103 is perpendicular to second main surface 2. First direction 101 is, for example, a <11-20> direction. Second direction 102 is, for example, a <1-100> direction. Third direction 103 is, for example, the <0001> direction. First direction 101 may be, for example, a direction obtained by projecting the <11-20> direction onto first main surface 1. Second direction 102 may be, for example, a direction obtained by projecting the <1-100> direction onto first main surface 1. Third direction 103 may be, for example, a direction inclined with respect to the <0001> direction.

Figure 4:
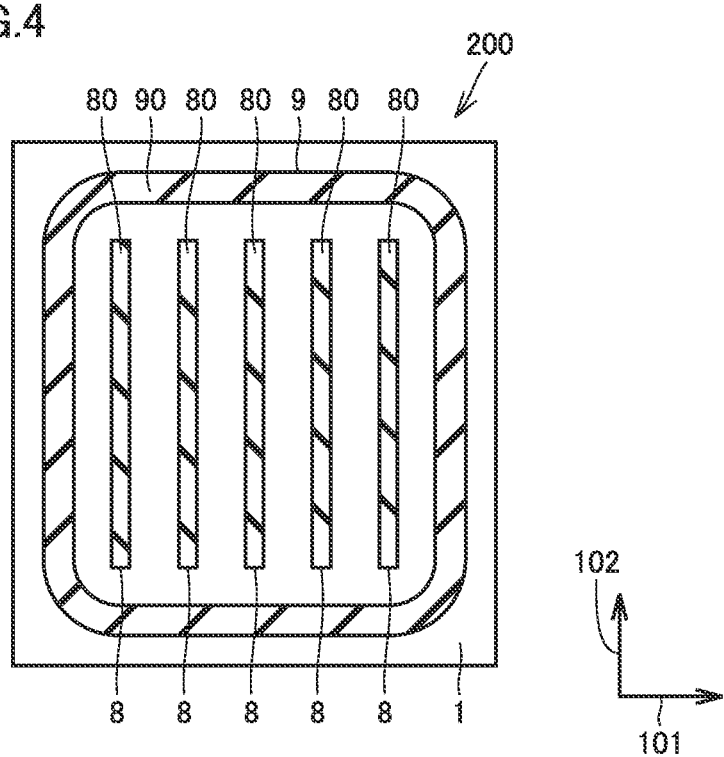
FIG. 4 is a schematic plan view showing the configuration of silicon carbide semiconductor device 200 according to the first embodiment.

FIG. 4 is a schematic plan view showing the configuration of silicon carbide semiconductor device 200 according to the first embodiment. FIG. 4 only shows first insulators 80, a second insulator 90, first trench 8, a second trench 9, and first main surface 1, and does not show the other configurations.

As shown in FIG. 4, the plurality of first trenches 8 are provided in first main surface 1 of silicon carbide substrate 100. Each of the plurality of first trenches 8 extends along second direction 102. The plurality of first trenches 8 are disposed to be separated from one another along first direction 101. Second trench 9 is provided in first main surface 1. As shown in FIG. 4, when viewed in the direction perpendicular to second main surface 2, second trench 9 has an annular shape. When viewed in the direction perpendicular to second main surface 2, second trench 9 surrounds first trench 8.

Silicon carbide semiconductor device 200 has second insulators 90. Second insulator 90 is provided inside second trench 9. When viewed in the direction perpendicular to second main surface 2, second insulator 90 has an annular shape.

When viewed in the direction perpendicular to second main surface 2, second insulator 90 surrounds first insulator 80.

Second Embodiment

Next, a configuration of a silicon carbide semiconductor device 200 according to a second embodiment will be described. Silicon carbide semiconductor device 200 according to the second embodiment is different from silicon carbide semiconductor device 200 according to the first embodiment mainly in terms of such a configuration that first region 31 and third region 33 are narrowed, and the other configurations are the same as those of silicon carbide semiconductor device 200 according to the first embodiment. Hereinafter, the configuration different from that of silicon carbide semiconductor device 200 according to the first embodiment will be mainly described.

Figure 5:
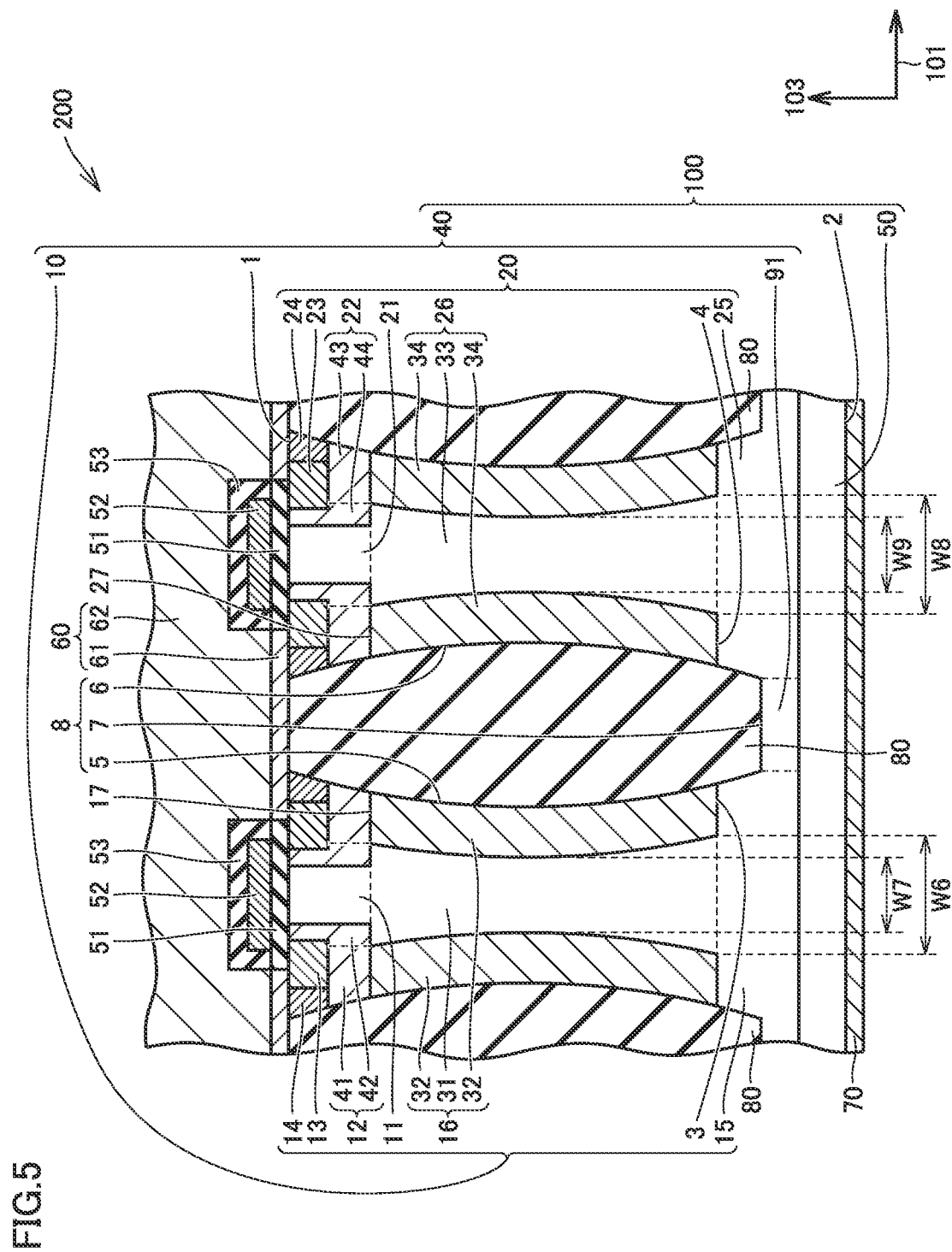
FIG. 5 is a schematic cross sectional view showing a configuration of a silicon carbide semiconductor device according to a second embodiment.

FIG. 5 is a schematic cross sectional view showing the configuration of silicon carbide semiconductor device 200 according to the second embodiment. As shown in FIG. 5, first side surface 5 of first trench 8 is in contact with second region 32. First side surface 5 is recessed from second region 32 toward first region 31. Second side surface 6 of first trench 8 is in contact with fourth region 34. Second side surface 6 is recessed from fourth region 34 toward third region 33. Each of first side surface 5 and second side surface 6 is curved.

As shown in FIG. 5, in the direction from first main surface 1 toward second main surface 2, the width of first region 31 at the central portion of first region 31 may be smaller than the width of first region 31 at the upper end portion of first region 31 and may be smaller than the width of first region 31 at the lower end portion of first region 31. In the direction from first region 31 toward second region 32, the maximum width (sixth width W6) of first region 31 is, for example, more than or equal to 0.5 μm and less than or equal to 5.0 μm. In the direction from first region 31 toward second region 32, the minimum width (seventh width W7) of first region 31 is, for example, more than or equal to 0.3 μm and less than or equal to 3.0 μm.

A value (first difference) obtained by subtracting the minimum width of first region 31 from the maximum width of first region 31 in the direction from first region 31 toward second region 32 may be, for example, more than or equal to 0.2 μm and less than or equal to 0.5 μm. The upper limit of the first difference is not particularly limited, but may be less than or equal to 1.0 μm or may be less than or equal to 2.0 μm, for example. The lower limit of the first difference is not particularly limited, but may be more than or equal to 0.1 μm or may be more than or equal to 0.05 μm, for example.

As shown in FIG. 5, in the direction from first main surface 1 toward second main surface 2, the width of third region 33 at the central portion of third region 33 may be smaller than the width of third region 33 at the upper end portion of third region 33 and may be smaller than the width of third region 33 at the lower end portion of third region 33. In the direction from third region 33 toward fourth region 34, the maximum width (eighth width W8) of third region 33 is, for example, more than or equal to 0.5 μm and less than or equal to 5.0 μm. In the direction from third region 33 toward fourth region 34, the minimum width (ninth width W9) of third region 33 is, for example, more than or equal to 0.3 μm and less than or equal to 3.0 μm.

A value (second difference) obtained by subtracting the minimum width of third region 33 from the maximum width of third region 33 in the direction from third region 33 toward fourth region 34 may be, for example, more than or equal to 0.2 μm and less than or equal to 0.5 μm. The upper limit of the second difference is not particularly limited, but may be less than or equal to 1.0 μm or may be less than or equal to 2.0 μm, for example. The lower limit of the second difference is not particularly limited, but may be more than or equal to 0.1 μm or may be more than or equal to 0.05 μm, for example.

Third Embodiment

Next, a configuration of a silicon carbide semiconductor device 200 according to a third embodiment will be described. Silicon carbide semiconductor device 200 according to the third embodiment is different from silicon carbide semiconductor device 200 according to the first embodiment in terms of such a configuration that silicon carbide semiconductor device 200 according to the third embodiment is a gate trench type MOSFET, and the other configurations are the same as those of silicon carbide semiconductor device 200 according to the first embodiment. Hereinafter, the configuration different from that of silicon carbide semiconductor device 200 according to the first embodiment will be mainly described.

Figure 6:
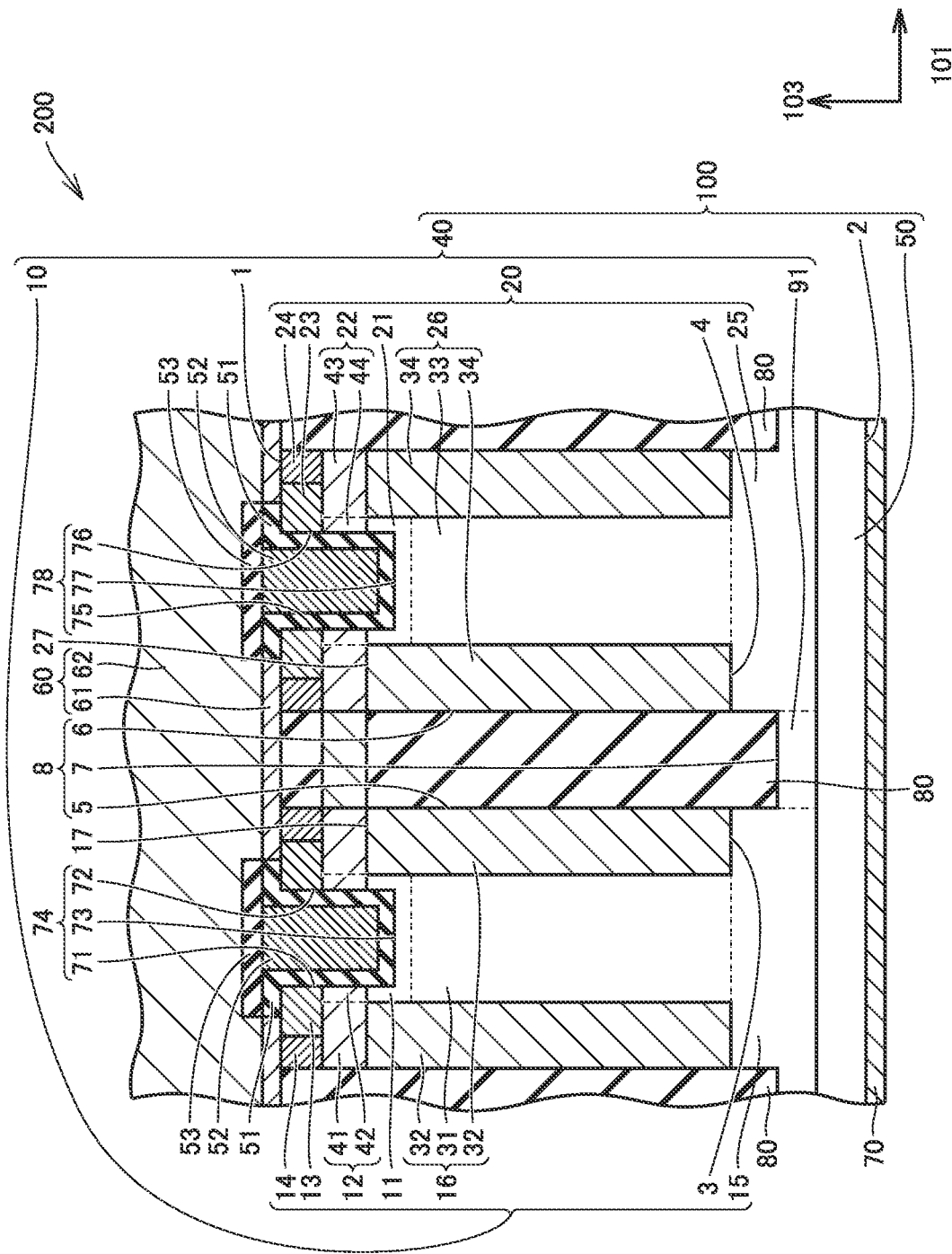
FIG. 6 is a schematic cross sectional view showing a configuration of a silicon carbide semiconductor device according to a third embodiment.

FIG. 6 is a schematic cross sectional view showing the configuration of silicon carbide semiconductor device 200 according to the third embodiment. As shown in FIG. 6, silicon carbide semiconductor device 200 according to the third embodiment is a gate trench type MOSFET.

As shown in FIG. 6, a first gate trench 74 is provided in first main surface 1. First gate trench 74 has a third side surface 71, a fourth side surface 72, and a second bottom surface 73. Fourth side surface 72 is opposite to third side surface 71. Each of third side surface 71 and fourth side surface 72 is contiguous to first main surface 1. Second bottom surface 73 is contiguous to each of third side surface 71 and fourth side surface 72. Second bottom surface 73 of first gate trench 74 is located at a position shallower than first bottom surface 7 of first trench 8. From another point of view, it can be said that a distance between second bottom surface 73 and first main surface 1 is shorter than a distance between first bottom surface 7 and first main surface 1 in the direction (third direction 103) perpendicular to second main surface 2.

Each of first impurity region 11, second impurity regions 12, and third impurity regions 13 is in contact with gate insulating film 51 at third side surface 71. Similarly, each of first impurity region 11, second impurity regions 12, and third impurity regions 13 is in contact with gate insulating film 51 at fourth side surface 72. First impurity region 11 is in contact with gate insulating film 51 at second bottom surface 73. Second regions 32 may face third side surface 71 and fourth side surface 72.

As shown in FIG. 6, a second gate trench 78 is provided in first main surface 1. Second gate trench 78 has a fifth side surface 75, a sixth side surface 76, and a third bottom surface 77. Sixth side surface 76 is opposite to fifth side surface 75. Each of fifth side surface 75 and sixth side surface 76 is contiguous to first main surface 1. Third bottom surface 77 is contiguous to each of fifth side surface 75 and sixth side surface 76. Third bottom surface 77 of second gate trench 78 is located at a position shallower than first bottom surface 7 of first trench 8. From another point of view, it can be said that a distance between third bottom surface 77 and first main surface 1 is shorter than a distance between first bottom surface 7 and first main surface 1 in the direction (third direction 103) perpendicular to second main surface 2.

Each of fourth impurity region 21, fifth impurity regions 22, and sixth impurity regions 23 is in contact with gate insulating film 51 at fifth side surface 75. Similarly, each of fourth impurity region 21, fifth impurity regions 22, and sixth impurity regions 23 is in contact with gate insulating film 51 at sixth side surface 76. Fourth impurity region 21 is in contact with gate insulating film 51 at third bottom surface 77. Fourth regions 34 may face fifth side surface 75 and sixth side surface 76.

Next, the following describes a method of measuring the concentration of the p type impurity and the concentration of the n type impurity in the impurity regions.

Each of the concentrations of the p type impurity and the n type impurity in the impurity regions can be measured using SIMS (Secondary Ion Mass Spectrometry). An exemplary measurement apparatus is a secondary ion mass spectrometer manufactured by Cameca. A measurement pitch is, for example, 0.01 μm. When the n type impurity to be detected is nitrogen, a primary ion beam is cesium (Cs). Primary ion energy is 14.5 keV. The polarity of the secondary ions is negative. When the p type impurity to be detected is aluminum or boron, the primary ion beam is oxygen ($O_2$). Primary ion energy is 8 keV. The polarity of the secondary ions is positive.

Next, the following describes a method of distinguishing the p type region and the n type region from each other.

In the method of distinguishing the p type region and the n type region from each other, an SCM (Scanning Capacitance Microscope) is used. An exemplary measurement apparatus is NanoScope IV manufactured by Bruker AXS. With the SCM, a carrier concentration distribution in a semiconductor is visualized. Specifically, a surface of a sample is scanned using a metal-coated silicon probe. On this occasion, a high frequency voltage is applied to the sample. Majority carriers are excited to modulate the capacitance of the system. The frequency of the high frequency voltage applied to the sample is 100 kHz, and the voltage is 4.0 V.

Fourth Embodiment

Next, a method of manufacturing a silicon carbide semiconductor device 200 according to a fourth embodiment will be described.

Figure 7:
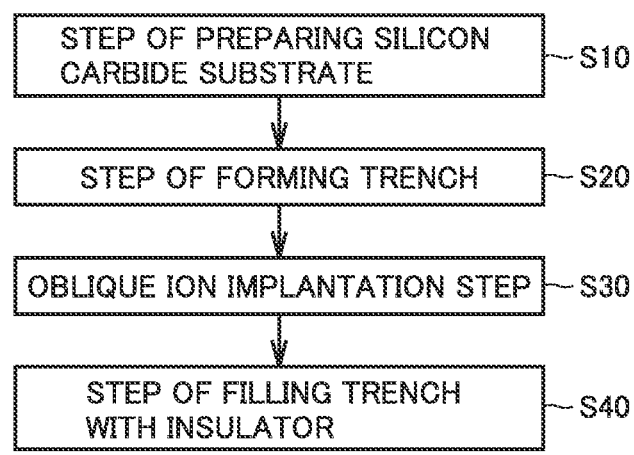
FIG. 7 is a flowchart schematically showing a method of manufacturing a silicon carbide semiconductor device according to a fourth embodiment.

First, a step (S10: FIG. 7) of preparing a silicon carbide substrate is performed. For example, a silicon carbide single crystal ingot grown by a Modified-Lely method is sliced to obtain a substrate, and a surface of the substrate is mirror-polished, thereby preparing silicon carbide single crystal substrate 50. Silicon carbide single crystal substrate 50 is, for example, hexagonal silicon carbide having a polytype of 4H. The diameter of silicon carbide single crystal substrate 50 is, for example, 150 mm.

Figure 8:
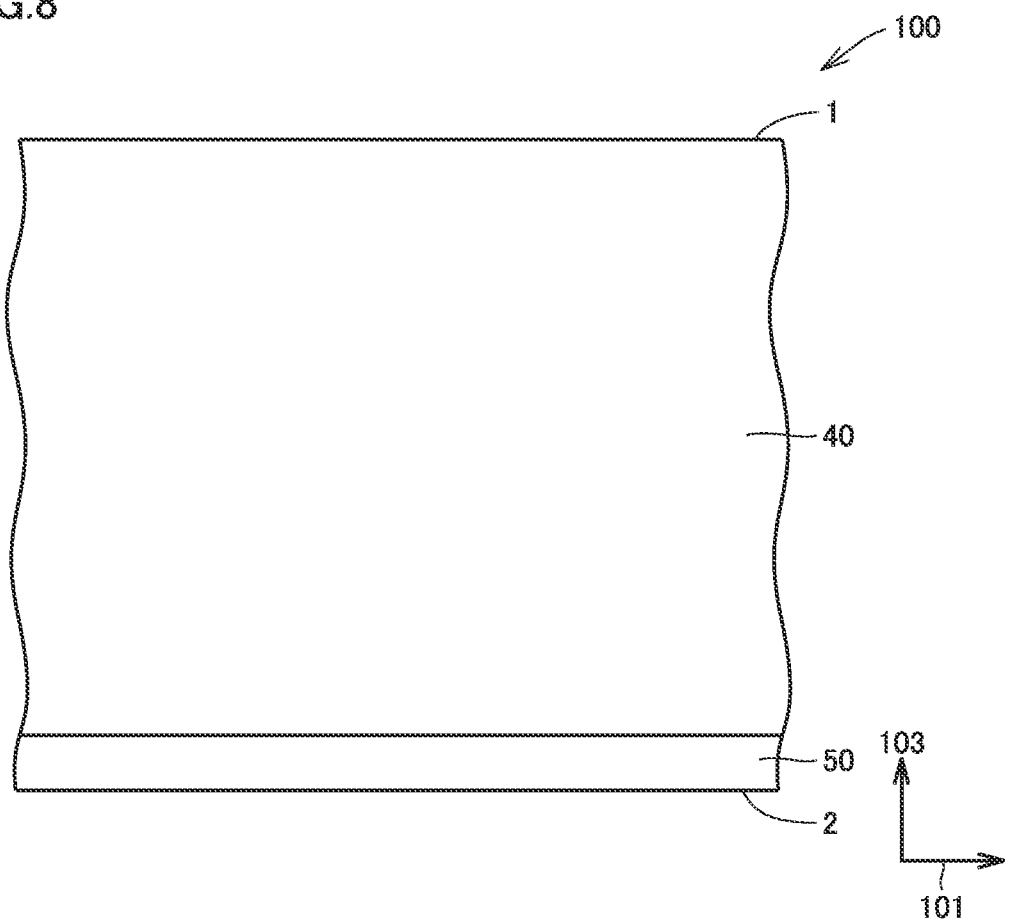
FIG. 8 is a schematic cross sectional view showing a first step of the method of manufacturing the silicon carbide semiconductor device according to the fourth embodiment.
Figure 9:
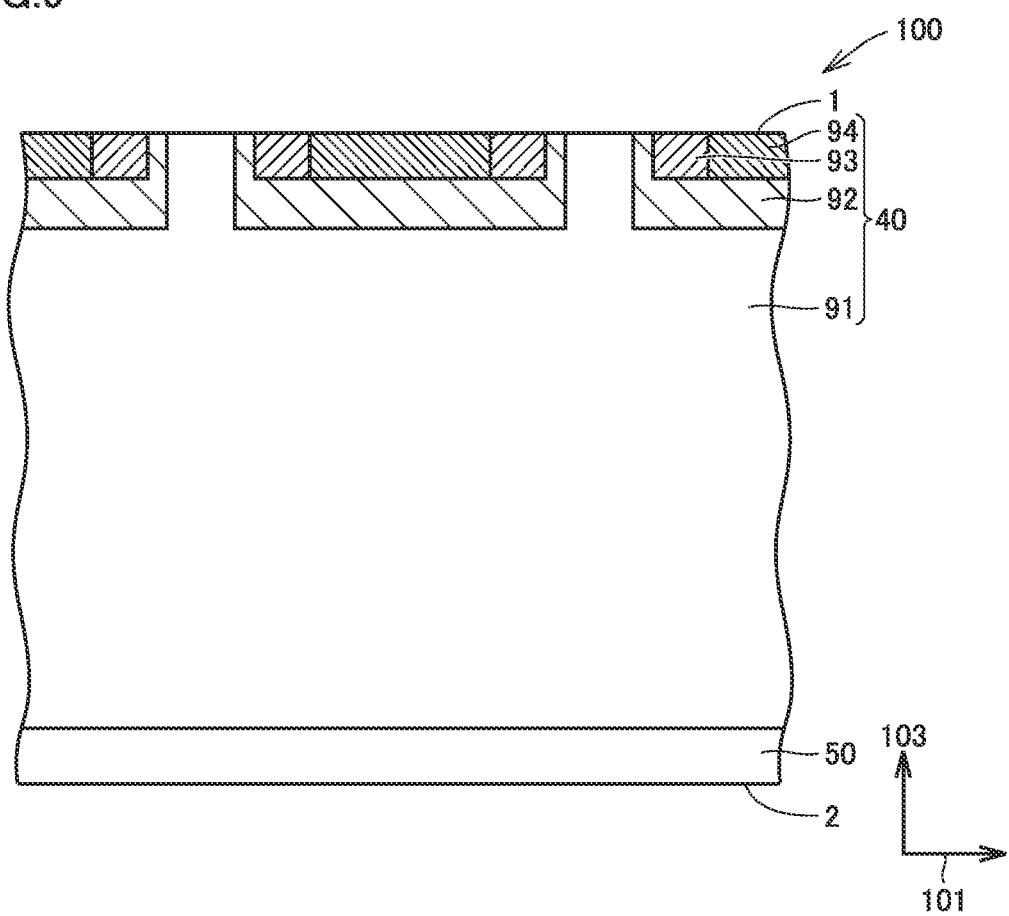
FIG. 9 is a schematic cross sectional view showing a second step of the method of manufacturing the silicon carbide semiconductor device according to the fourth embodiment.

Next, a step of forming silicon carbide epitaxial layer 40 is performed. For example, a carrier gas including hydrogen, a source material gas including silane and propane, and a dopant gas including nitrogen are supplied onto silicon carbide single crystal substrate 50, and silicon carbide single crystal substrate 50 is heated to, for example, about 1550° C. under a pressure of 10 kPa. Thus, silicon carbide epitaxial layer 40 having the n type is formed on silicon carbide single crystal substrate 50 (see FIG. 8).

In this way, silicon carbide substrate 100 is prepared which includes silicon carbide single crystal substrate 50 and silicon carbide epitaxial layer 40 provided on silicon carbide single crystal substrate 50. Silicon carbide epitaxial layer 40 has impurity ions capable of imparting the n type (first conductivity type). First main surface 1 of silicon carbide epitaxial layer 40 corresponds to, for example, the {0001} plane or a plane angled off by less than or equal to about 8° with respect to the {0001} plane.

Next, ion implantation is performed into silicon carbide epitaxial layer 40. First, ions of a p type impurity are implanted into silicon carbide epitaxial layer 40. Thus, first p type impurity regions 92 are formed. The p type impurity is, for example, aluminum. Next, ions of an n type impurity are implanted into each of first p type impurity regions 92. Thus, a first n type impurity region 93 is formed. First n type impurity region 93 is formed in contact with first p type impurity region 92. The n type impurity is, for example, phosphorus. Next, ions of a p type impurity are implanted into first n type impurity region 93. Thus, a second p type impurity region 94 is formed. The p type impurity is, for example, aluminum. First p type impurity region 92 is to serve as second impurity region 12 and fifth impurity region 22. First n type impurity region 93 is to serve as third impurity region 13 and sixth impurity region 23. Second p type impurity region 94 is to serve as first contact region 14 and second contact region 24.

A step (S20: FIG. 7) of forming a trench is performed. First, a mask layer 54 is formed on first main surface 1. Mask layer 54 is composed of, for example, a material including a deposited oxide film. Mask layer 54 is provided with an opening formed in conformity with a region in which first trench 8 is to be formed. Next, silicon carbide epitaxial layer 40 is etched using mask layer 54.

Figure 10:
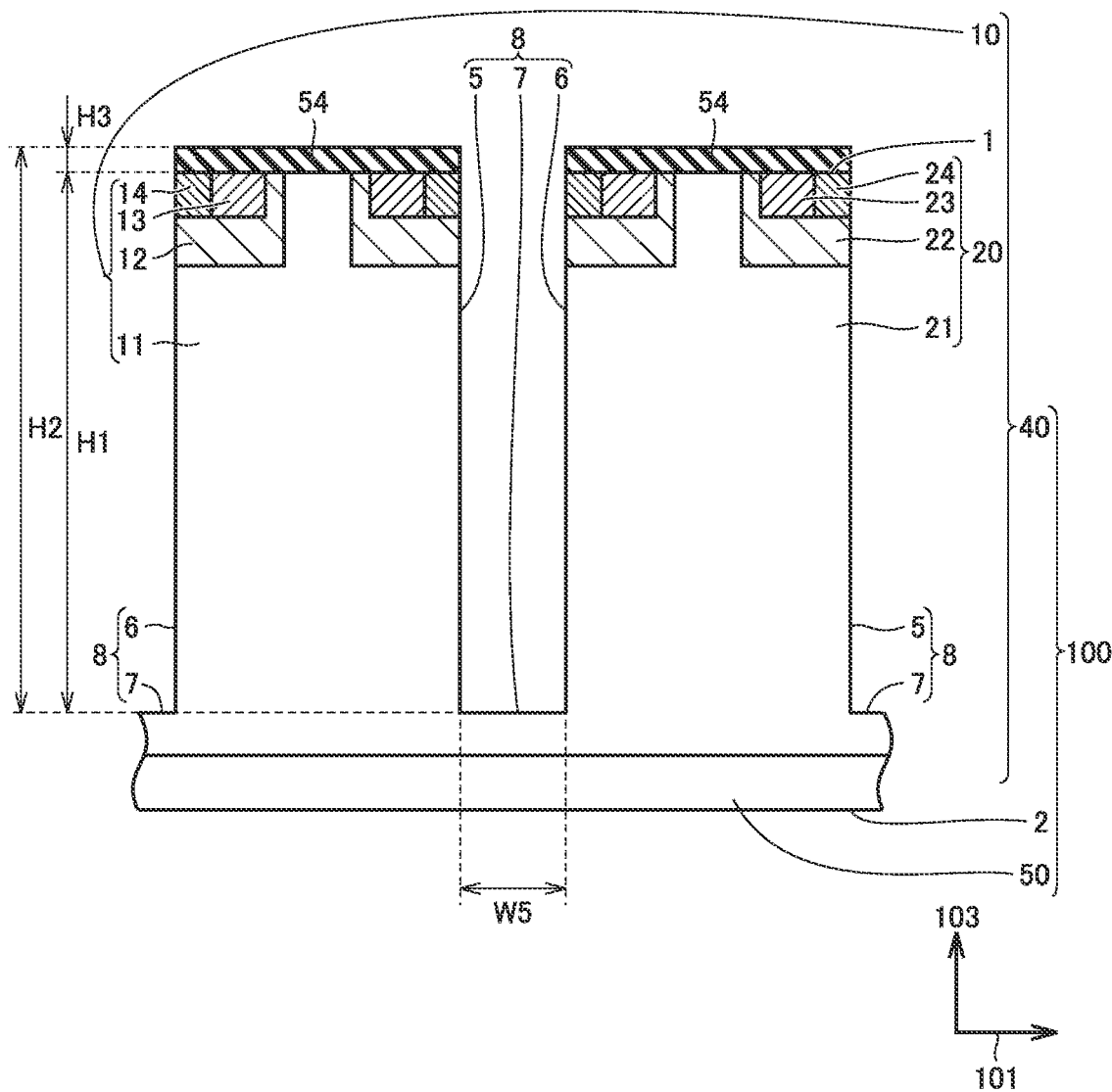
FIG. 10 is a schematic cross sectional view showing a third step of the method of manufacturing the silicon carbide semiconductor device according to the fourth embodiment.

In this way, first trench 8 is formed in silicon carbide epitaxial layer 40 (see FIG. 10). First trench 8 has first side surface 5, second side surface 6, and first bottom surface 7. Second side surface 6 is opposite to first side surface 5. First bottom surface 7 is contiguous to each of first side surface 5 and second side surface 6. The depth (first depth H1) of first trench 8 is, for example, more than or equal to 3 μm and less than or equal to 30 μm. The width (fifth width W5) of first trench 8 is, for example, more than or equal to 1 μm and less than or equal to 3 μm.

Next, etching conditions will be described. First trench 8 having first side surface 5 and second side surface 6 each in the form of a straight line is formed by using conditions to attain a sufficiently large amount of C deposit on each of the sidewalls of the trench as a protective film for the sidewall against the etching employing plasma in the trench (see FIG. 1). On the other hand, first trench 8 is formed to be expanded to both sides in the lateral direction by using conditions to attain an insufficient amount of C deposit on each of the sidewalls of the trench (see FIG. 5).

Next, an oblique ion implantation step (S30: FIG. 7) is performed. Specifically, impurity ions capable of imparting the p type (second conductivity type) such as aluminum are obliquely implanted into first side surface 5 of first trench 8 with mask layer 54 being disposed on first main surface 1. Thus, second region 32 exposed at first side surface 5 is formed (see FIG. 11). Next, impurity ions capable of imparting the p type such as aluminum are obliquely implanted into second side surface 6 of first trench 8. Thus, fourth region 34 exposed at second side surface 6 is formed (see FIG. 12). It should be noted that after the impurity ions capable of imparting the p type are implanted obliquely into second side surface 6, the impurity ions capable of imparting the p type may be obliquely implanted into first side surface 5.

According to the method of manufacturing silicon carbide semiconductor device 200 according to the third embodiment, in each of the step of forming second region 32 and the step of forming fourth region 34, oblique implantation is performed to avoid the impurity ions capable of imparting the second conductivity type from being implanted into bottom surface 7. Specifically, when it is assumed that the width of first trench 8 is fifth width W5, the depth of first trench 8 is first depth H1, the thickness of mask layer 54 is first thickness H3, and the total of first thickness H3 and first depth H1 is second thickness H2, an angle (first angle θ1) at which the ion implantation can be performed to a boundary between first side surface 5 and first bottom surface 7 is an angle represented by an arc tangent of a value obtained by dividing second thickness H2 by fifth width W5 (see FIG. 11). Therefore, in order to perform ion implantation into first side surface 5 and avoid ion implantation into first bottom surface 7, an angle formed between silicon carbide substrate 100 and the ion implantation direction is adjusted such that an angle with respect to a plane parallel to first bottom surface 7 is an angle (second angle θ2) smaller than first angle θ1.

In this way, second regions 32 and fourth regions 34 are formed in silicon carbide epitaxial layer 40. A portion of silicon carbide epitaxial layer 40 between the pair of second regions 32 serves as first region 31. A portion of silicon carbide epitaxial layer 40 between the pair of fourth regions 34 serves as third region 33. In a direction perpendicular to a boundary surface 45 between silicon carbide single crystal substrate 50 and silicon carbide epitaxial layer 40, second bottom surface 73 of first trench 8 is located between silicon carbide single crystal substrate 50 and each of second regions 32 and fourth regions 34. From another point of view, it can be said that second bottom surface 73 of first trench 8 is located on the second main surface 2 side with respect to each of second regions 32 and fourth regions 34. Activation annealing may be performed after the oblique ion implantation step (S30: FIG. 7).

Silicon carbide epitaxial layer 40 includes first superjunction portion 16 having first region 31 and second regions 32, first region 31 having the n type, second regions 32 having the p type. First region 31 is in contact with second regions 32. First region 31 and second regions 32 form first superjunction portion 16. Silicon carbide epitaxial layer 40 includes second superjunction portion 26 having third region 33 and fourth regions 34, third region 33 having the n type, fourth regions 34 having the p type. Third region 33 is in contact with fourth regions 34. Third region 33 and fourth regions 34 form second superjunction portion 26. In first direction 101, first superjunction portion 16 and second superjunction portion 26 are alternately disposed.

Figure 11:
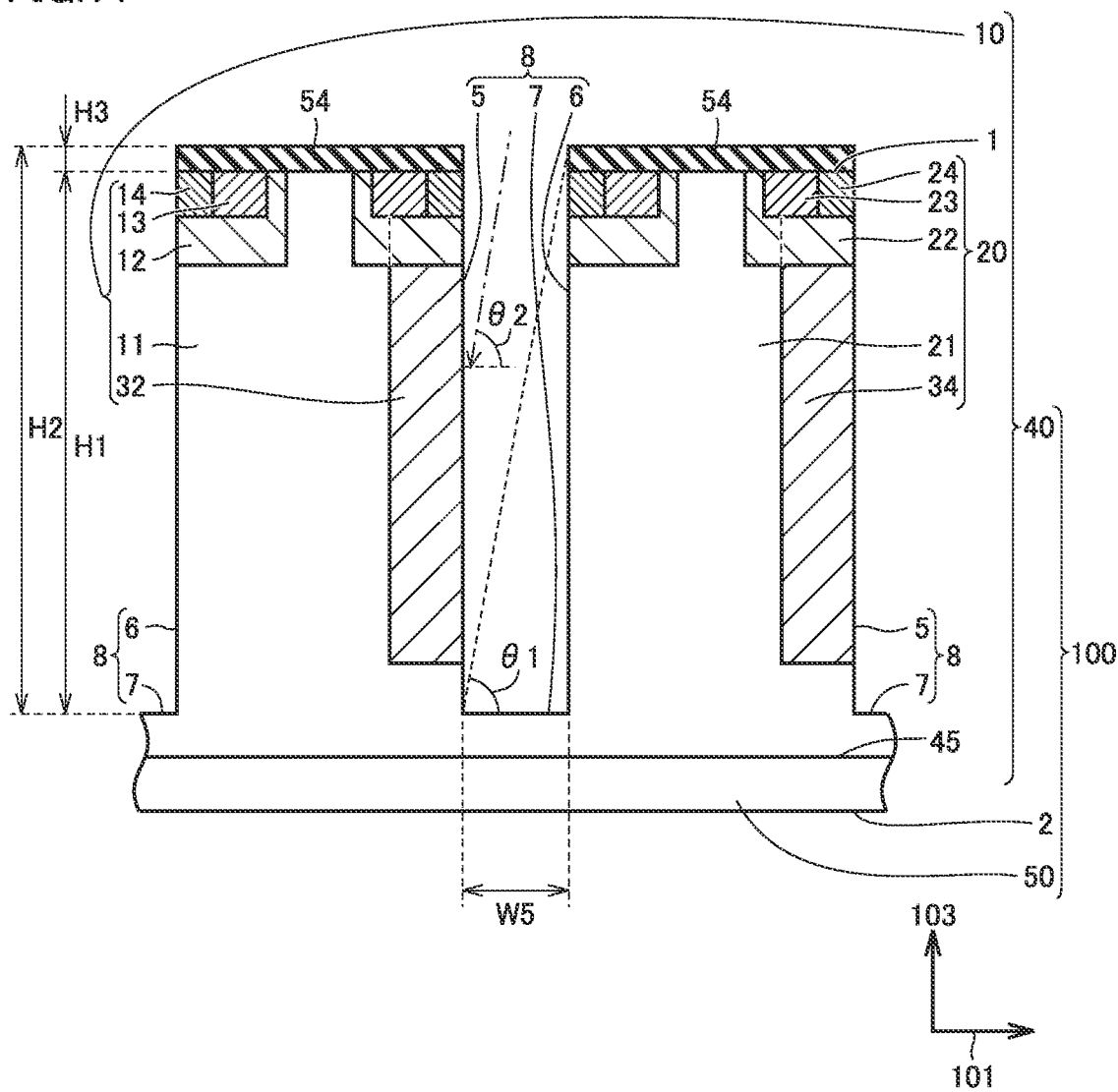
FIG. 11 is a schematic cross sectional view showing a fourth step of the method of manufacturing the silicon carbide semiconductor device according to the fourth embodiment.
Figure 12:
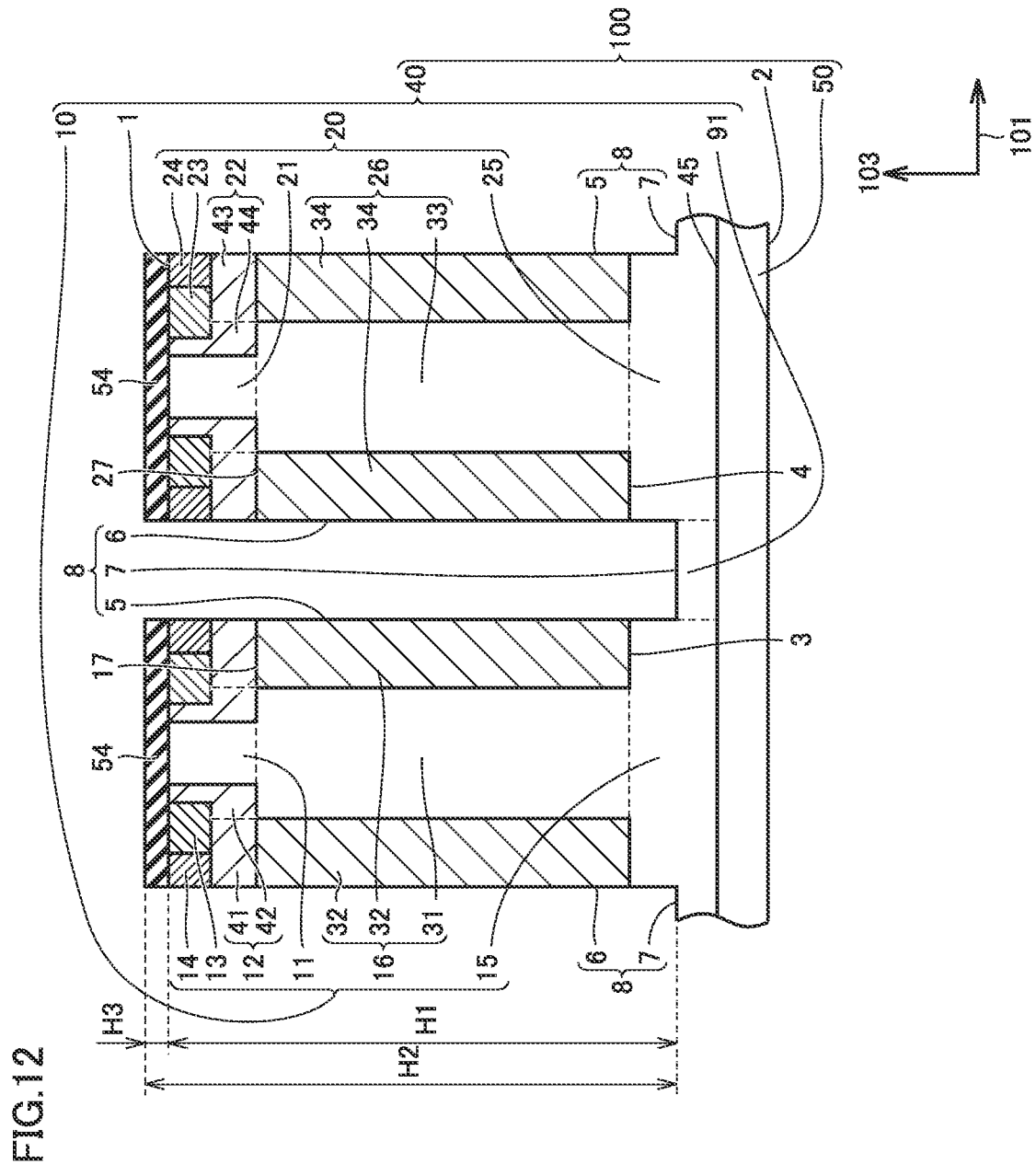
FIG. 12 is a schematic cross sectional view showing a fifth step of the method of manufacturing the silicon carbide semiconductor device according to the fourth embodiment.

It should be noted that as shown in FIGS. 11 and 12, in the oblique ion implantation step (S30: FIG. 7), part of the impurity ions capable of imparting the p type may be implanted into a portion of each of second impurity regions 12, third impurity regions 13, first contact regions 14, fifth impurity regions 22, sixth impurity regions 23, and second contact regions 24.

Figure 13:
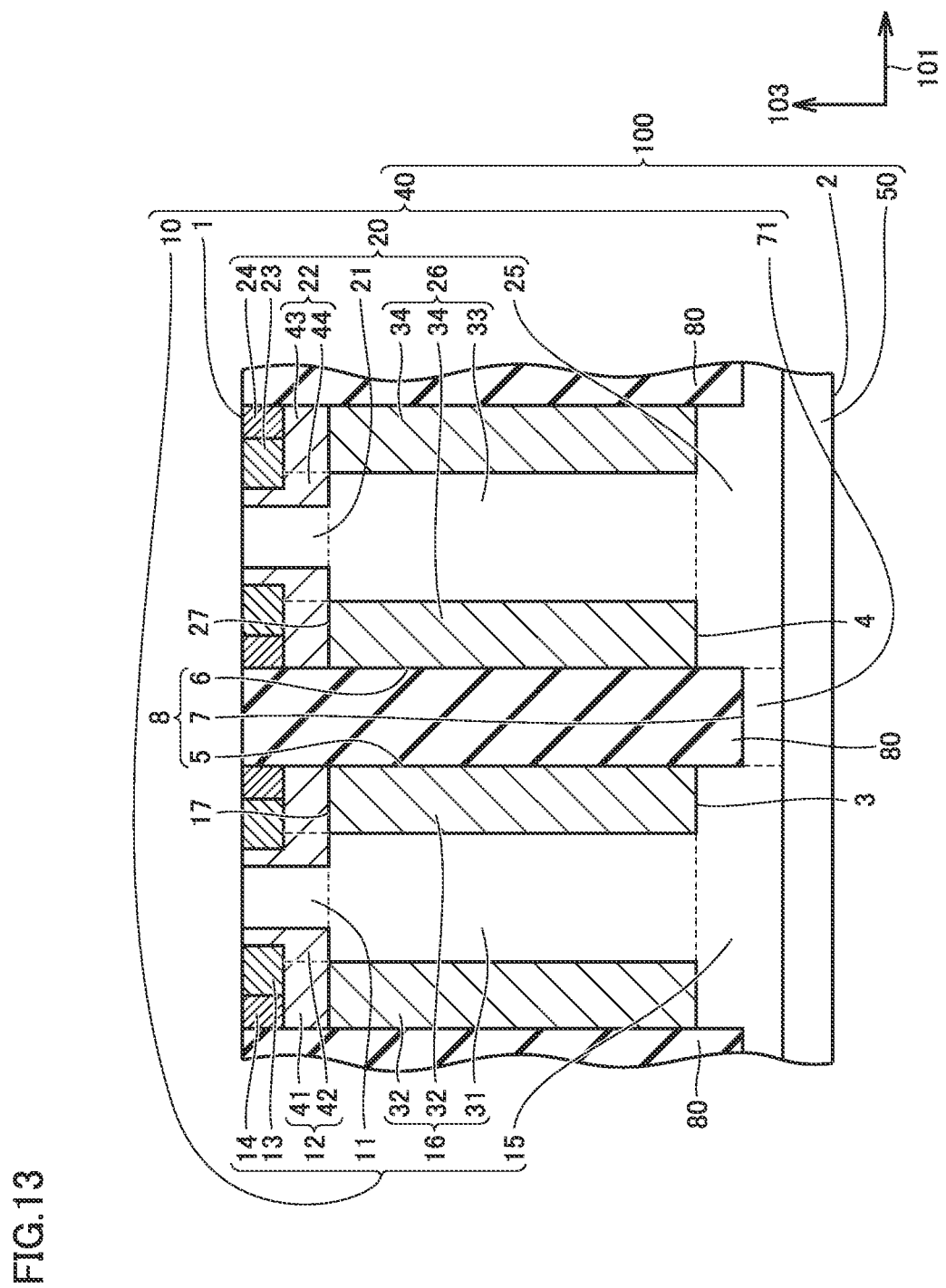
FIG. 13 is a schematic cross sectional view showing a sixth step of the method of manufacturing the silicon carbide semiconductor device according to the fourth embodiment.

Next, a step (S40: FIG. 7) of filling the trench with an insulator is performed. For example, when first insulator 80 is a BCB resin or SOG, first insulator 80 is formed inside each first trench 8 by a spin coating method. In this way, first trench 8 is filled with first insulator 80 (see FIG. 13).

Next, gate insulating films 51 are formed. Specifically, gate insulating films 51 are formed on first main surface 1. Gate insulating film 51 is in contact with first impurity region 11, second impurity regions 12, and third impurity regions 13 at first main surface 1. Similarly, gate insulating film 51 is in contact with fourth impurity region 21, fifth impurity regions 22, and sixth impurity regions 23 at first main surface 1. The thickness of each gate insulating film 51 is, for example, more than or equal to 40 nm and less than or equal to 150 nm.

Figure 14:
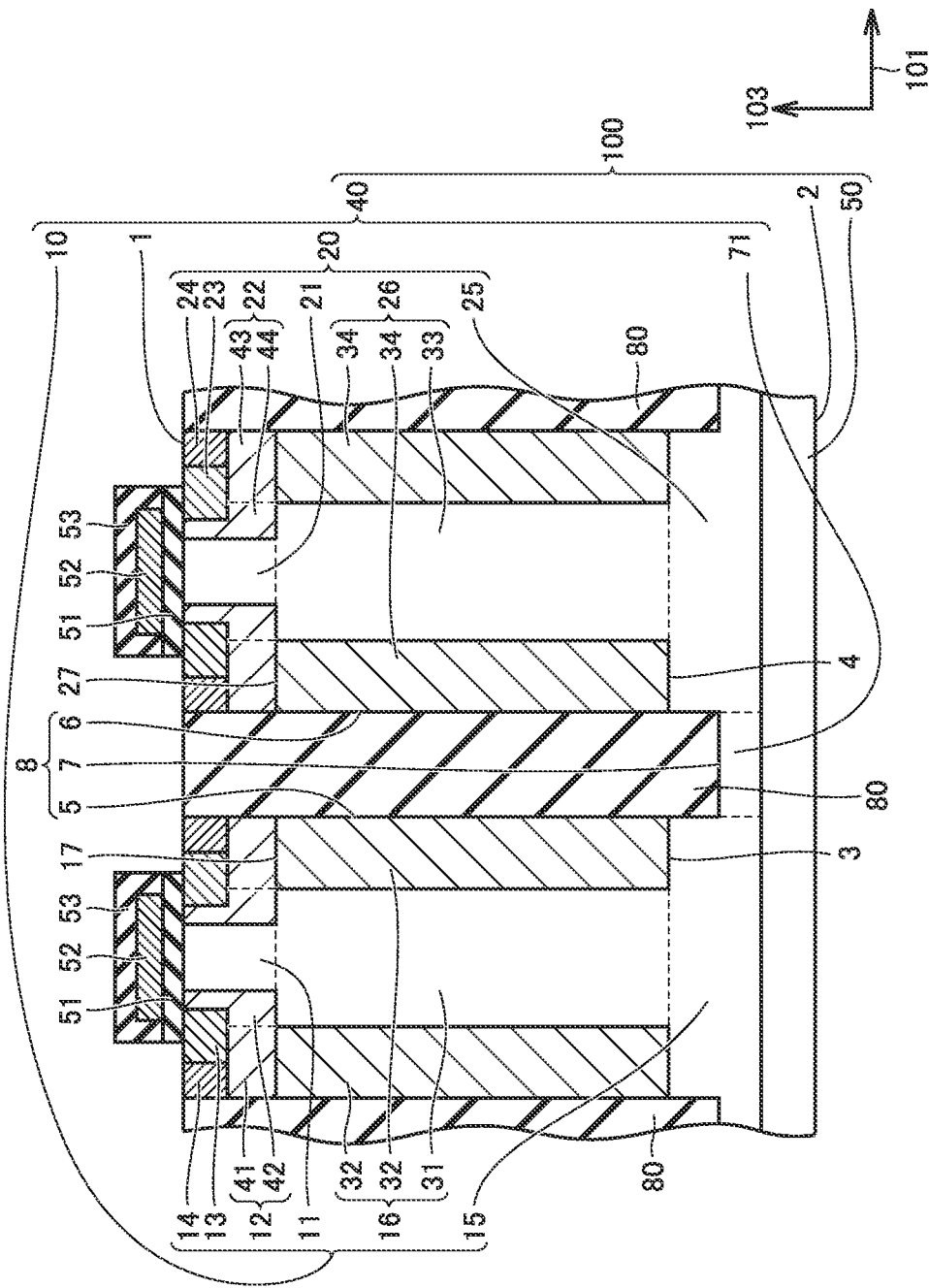
FIG. 14 is a schematic cross sectional view showing a seventh step of the method of manufacturing the silicon carbide semiconductor device according to the fourth embodiment.

Next, gate electrodes 52 are formed. Specifically, gate electrodes 52 are formed on respective gate insulating films 51. Each of gate electrodes 52 is composed of, for example, a material including polysilicon including an impurity. Next, separation insulating films 53 are formed to cover respective gate electrodes 52. Each of separation insulating films 53 is, for example, a silicon dioxide film (see FIG. 14).

Next, first electrode 60 is formed. First electrode 60 is formed to extend over first trench 8. Specifically, first electrode 60 is formed in contact with third impurity regions 13, first contact regions 14, first insulators 80, second contact regions 24, and sixth impurity regions 23 at first main surface 1. First electrode 60 includes electrode layers 61. Each of electrode layers 61 is formed by sputtering, for example. Electrode layer 61 is composed of a material including Ti, Al, and Si, for example.

Next, silicon carbide substrate 100 having electrode layers 61 formed thereon is subjected to RTA (Rapid Thermal Anneal) for about 2 minutes at more than or equal to 900° C. and less than or equal to 1100° C., for example. Thus, at least a portion of each electrode layer 61 reacts with silicon included in silicon carbide substrate 100, thus resulting in silicidation. Accordingly, electrode layer 61 is in ohmic contact with each of third impurity region 13 and sixth impurity region 23. Preferably, electrode layer 61 is in ohmic contact with each of first contact region 14 and second contact region 24.

Next, source wiring 62 is formed. Source wiring 62 is formed to extend over first trench 8. Specifically, source wiring 62 is formed in contact with electrode layers 61 to cover first insulators 80. Source wiring 62 is preferably composed of a material including Al. Next, backside surface polishing is performed onto silicon carbide single crystal substrate 50. Thus, the thickness of silicon carbide single crystal substrate 50 is reduced.

Next, second electrode 70 is formed. Second electrode 70 is formed in contact with second main surface 2 of silicon carbide substrate 100. Second electrode 70 is composed of a material including NiSi, for example. Second electrode 70 is preferably formed by the sputtering method, but may be formed by vapor deposition. After second electrode 70 is formed, second electrode 70 is heated by, for example, laser annealing. Thus, at least a portion of second electrode 70 is silicided. In this way, MOSFET 200 shown in FIG. 1 is manufactured.

Fifth Embodiment

Next, a method of manufacturing a silicon carbide semiconductor device 200 according to the fifth embodiment will be described. The method of manufacturing silicon carbide semiconductor device 200 according to the fifth embodiment is different from the method of manufacturing silicon carbide semiconductor device 200 according to the fourth embodiment mainly in terms of steps in which ion implantation is performed into first bottom surface 7 of first trench 8, and the other steps are the same as those in the method of manufacturing silicon carbide semiconductor device 200 according to the fourth embodiment. Hereinafter, the steps different from those of the method of manufacturing silicon carbide semiconductor device 200 according to the fourth embodiment will be mainly described.

Figure 15:
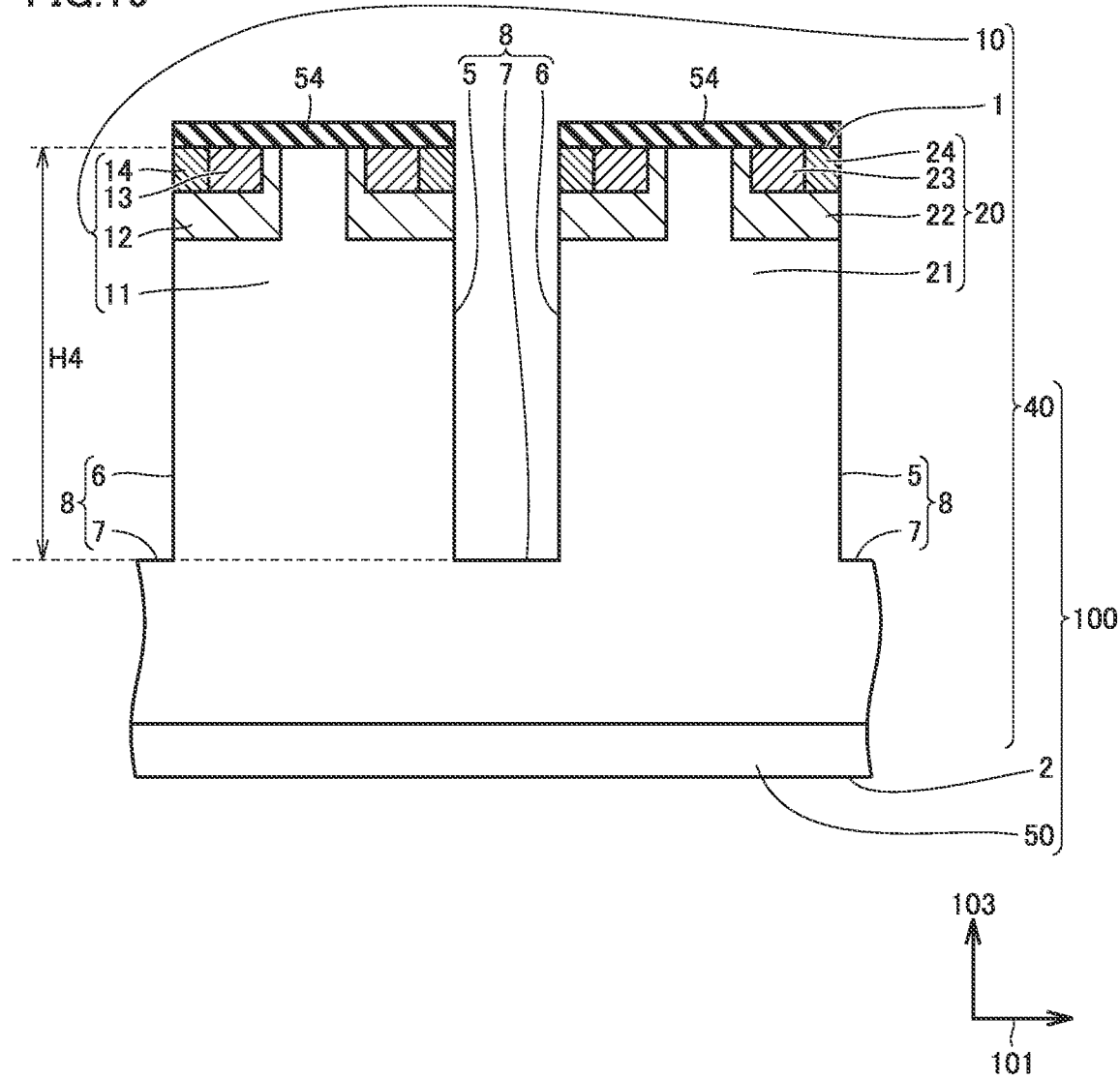
FIG. 15 is a schematic cross sectional view showing a first step of a method of manufacturing a silicon carbide semiconductor device according to a fifth embodiment.

As shown in FIG. 15, the depth (second depth H4) of first trench 8 in the step (S20: FIG. 7) of forming trench 8 of silicon carbide semiconductor device 200 according to the fifth embodiment is shallower than the depth (first depth H1) of first trench 8 in the step (S20: FIG. 7) of forming trench 8 in the method of manufacturing silicon carbide semiconductor device 200 according to the fourth embodiment. Second depth H4 is, for example, more than or equal to 2.5 µm and less than or equal to 29.5 µm.

Figure 16:
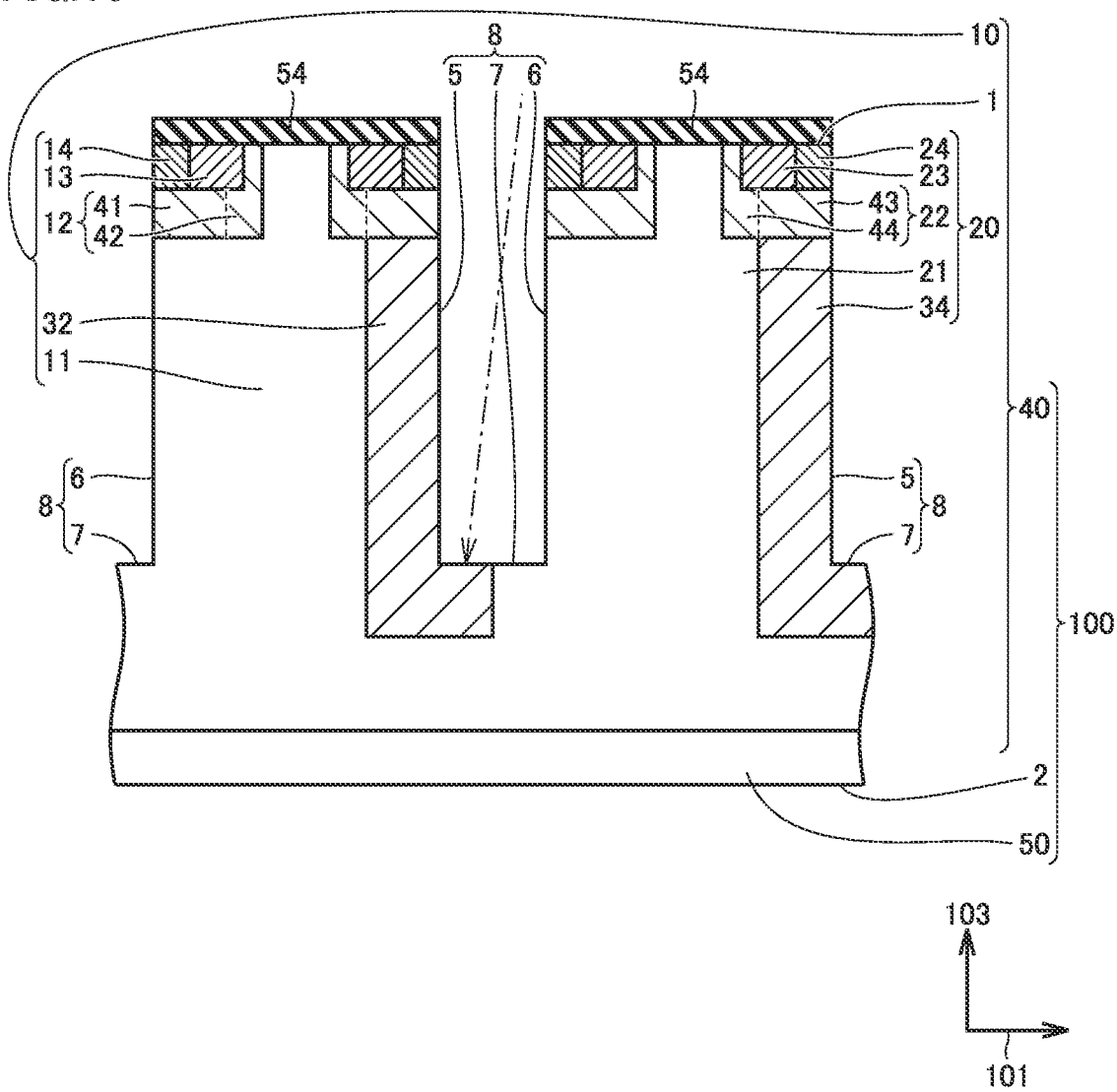
FIG. 16 is a schematic cross sectional view showing a second step of the method of manufacturing the silicon carbide semiconductor device according to the fifth embodiment.

Next, the oblique ion implantation step (S30: FIG. 7) is performed. Specifically, impurity ions capable of imparting the p type (second conductivity type) such as aluminum are obliquely implanted into first side surface 5 and first bottom surface 7 of first trench 8 with mask layer 54 being disposed on first main surface 1. Thus, second region 32 exposed at first side surface 5 and first bottom surface 7 is formed (see FIG. 16). Next, impurity ions capable of imparting the p type such as aluminum are obliquely implanted into second side surface 6 and first bottom surface 7 of first trench 8. Thus, fourth region 34 exposed at second side surface 6 and first bottom surface 7 is formed (see FIG. 17).

Thus, according to the method of manufacturing silicon carbide semiconductor device 200 according to the fifth embodiment, the impurity ions capable of imparting the second conductivity type are implanted into bottom surface 7 in each of the step of forming second region 32 and the step of forming fourth region 34.

Next, additional etching is performed. Specifically, the impurity ions capable of imparting the p type and implanted in first bottom surface 7 of first trench 8 are removed by the additional etching. Thus, the depth of first trench 8 is changed from second depth H4 to first depth H1 (see FIG. 11). As a result, first bottom surface 7 of first trench 8 is exposed at third lower drift region 91 having the n type. As shown in FIG. 11, in the direction perpendicular to boundary surface 45 between silicon carbide single crystal substrate 50 and silicon carbide epitaxial layer 40, first bottom surface 7 of first trench 8 is located between silicon carbide single crystal substrate 50 and each of second regions 32 and fourth regions 34. The subsequent steps are the same as those of the method of manufacturing silicon carbide semiconductor device 200 according to the fourth embodiment.

In the above description, it has been illustrated that the first conductivity type is the n type and the second conductivity type is the p type; however, the first conductivity type may be the p type and the second conductivity type may be the n type. Further, in the above description, silicon carbide semiconductor device 200 according to the present disclosure has been described by illustrating the MOSFET; however, silicon carbide semiconductor device 200 according to the present disclosure is not limited to the MOSFET. Silicon carbide semiconductor device 200 according to the present disclosure may be, for example, an IGBT (Insulated Gate Bipolar Transistor) or the like.

Next, the following describes functions and effects of silicon carbide semiconductor devices 200 and the methods of manufacturing silicon carbide semiconductor devices 200 according to the above embodiments.

Figure 17:
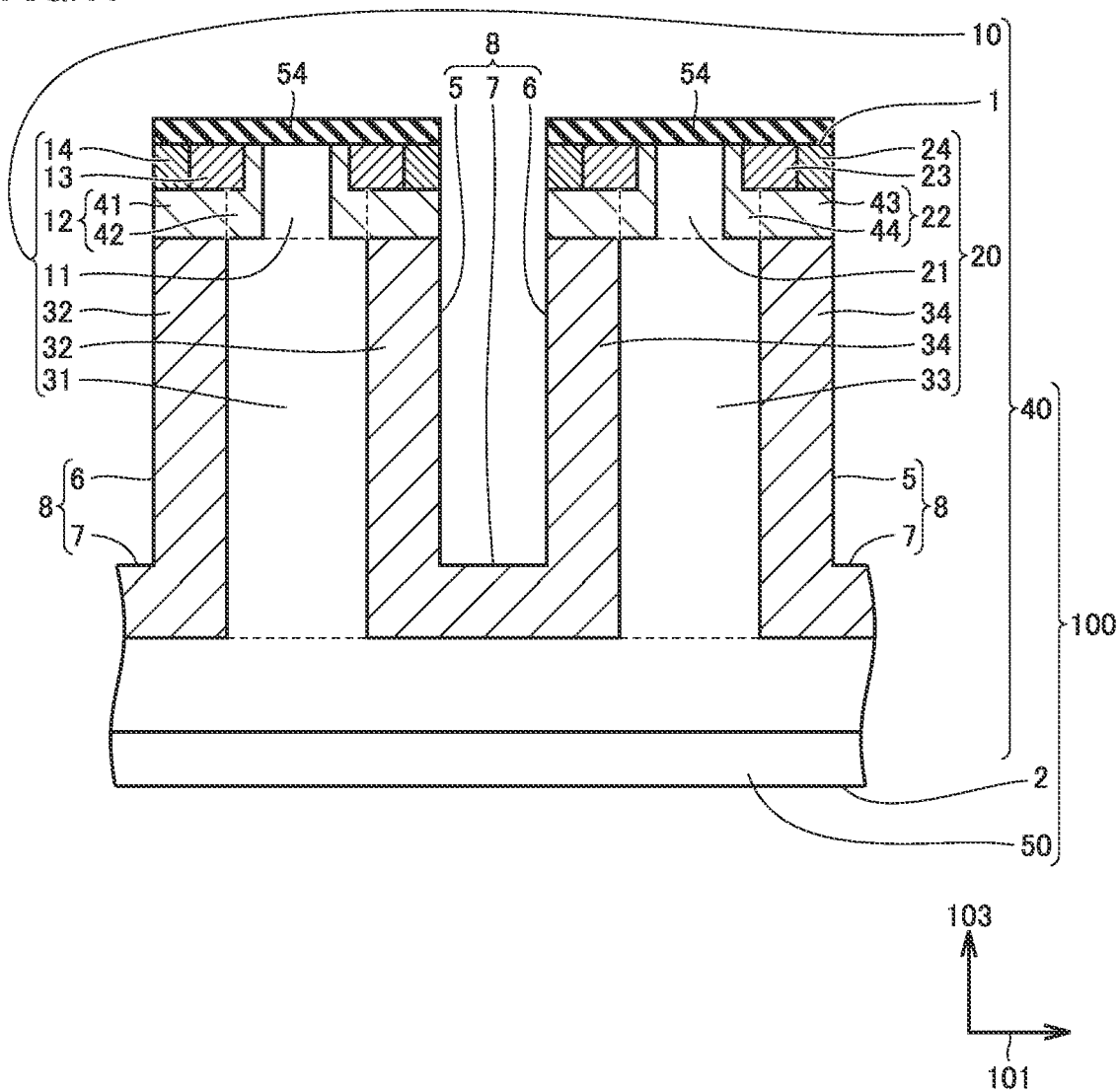
FIG. 17 is a schematic cross sectional view showing a third step of the method of manufacturing the silicon carbide semiconductor device according to the fifth embodiment.

As shown in FIG. 17, when second region 32 is in contact with first bottom surface 7 of first trench 8, the width of second region 32 located on the second main surface 2 side with respect to first bottom surface 7 is larger than the width of second region 32 located on the first main surface 1 side with respect to first bottom surface 7. In this case, a charge balance between second region 32 and first region 31 on the second main surface 2 side with respect to first bottom surface 7 is different from a charge balance between second region 32 and first region 31 on the first main surface 1 side with respect to first bottom surface 7. Similarly, a charge balance between fourth region 34 and third region 33 on the second main surface 2 side with respect to first bottom surface 7 is different from a charge balance between fourth region 34 and third region 33 on the first main surface 1 side with respect to first bottom surface 7. Therefore, each of the charge balance between second region 32 and first region 31 and the charge balance between fourth region 34 and third region 33 is lost. In other words, it is difficult to excellently maintain a charge balance in each superjunction portion.

On the other hand, according to each of silicon carbide semiconductor devices 200 and the methods of manufacturing silicon carbide semiconductor devices 200 according to the above embodiments, in the direction perpendicular to second main surface 2, first bottom surface 7 of first trench 8 is located between the bottom surface (second end surface 3) of second region 32 and second main surface 2, and is located between the bottom surface (fourth end surface 4) of fourth region 34 and second main surface 2. In this case, second region 32 is separated from first bottom surface 7 of first trench 8. Therefore, unlike the case where second region 32 is in contact with first bottom surface 7 of first trench 8, the width of second region 32 is maintained to be substantially unchanged in the direction perpendicular to second main surface 2. Similarly, fourth region 34 is separated from first bottom surface 7 of first trench 8. Therefore, unlike the case where fourth region 34 is in contact with first bottom surface 7 of first trench 8, the width of fourth region 34 is maintained to be substantially unchanged in the direction perpendicular to second main surface 2. As a result, each of the charge balance between second region 32 and first region 31 and the charge balance between fourth region 34 and third region 33 can be suppressed from being lost. In other words, a charge balance in each superjunction portion can be maintained excellently.

A deep superjunction portion is manufactured normally by repeating an epitaxial growth step and an ion implantation step. However, when this manufacturing method is used, the manufacturing process becomes significantly long, thus resulting in increased cost. Further, by repeating the epitaxial growth step and the ion implantation step, impurity concentrations in the respective epitaxial layers may greatly differ.

On the other hand, according to the method of manufacturing silicon carbide semiconductor device 200 according to the present embodiment, trench 8 having first side surface 5 and second side surface 6 opposite to first side surface 5 is formed in silicon carbide epitaxial layer 40. Second region 32 is formed by obliquely implanting, into to first side surface 5, the impurity ions capable of imparting the second conductivity type. Fourth region 34 is formed by obliquely implanting, into second side surface 6, the impurity ions capable of imparting the second conductivity type. Thus, a deep superjunction portion can be manufactured by such a simple method. Therefore, the manufacturing process can be significantly shortened.

When the epitaxial growth process is performed once, variation in impurity concentration in the direction perpendicular to second main surface 2 can be reduced as compared with the case where the epitaxial growth step is repeated twice or more. Therefore, a charge balance in the superjunction portion can be excellently maintained.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 3: second end surface; 4: fourth end surface; 5: first side surface; 6: second side surface; 7: first bottom surface (bottom surface); 8: first trench (trench); 9: second trench; 10: first mesa region; 11: first impurity region; 12: second impurity region; 13: third impurity region; 14: first contact region; 15: first lower drift region; 16: first superjunction portion; 17: first end surface; 20: second mesa region; 21: fourth impurity region; 22: fifth impurity region; 23: sixth impurity region; 24: second contact region; 25: second lower drift region; 26: second superjunction portion; 27: third end surface; 31: first region; 32: second region; 33: third region; 34: fourth region; 40: silicon carbide epitaxial layer; 41: fifth region; 42: sixth region; 43: seventh region; 44: eighth region; 45: boundary surface; 50: silicon carbide single crystal substrate; 51: gate insulating film; 52: gate electrode; 53: separation insulating film; 54: mask layer; 60: first electrode; 61: electrode layer; 62: source wiring; 70: second electrode; 71: third side surface; 72: fourth side surface; 73: second bottom surface; 74: first gate trench; 75: fifth side surface; 76: sixth side surface; 77: third bottom surface; 78: second gate trench; 80: insulator (first insulator); 90: second insulator; 91: third lower drift region; 92: first p type impurity region; 93: first n type impurity region; 94: second p type impurity region; 100: silicon carbide substrate; 101: first direction; 102: second direction; 103: third direction; 200: silicon carbide semiconductor device (MOSFET); H1: first depth; H2: second thickness; H3: first thickness; H4: second depth; W1: first width; W2: second width; W3: third width; W4: fourth width; W5: fifth width; W6: sixth width; W7: seventh width; W8: eighth width; W9: ninth width.

The invention claimed is:

1. A silicon carbide semiconductor device comprising a silicon carbide substrate having a first main surface and a second main surface opposite to the first main surface, wherein the silicon carbide substrate includes a first impurity region located between the first main surface and the second main surface, the first impurity region having a first conductivity type, a second impurity region located between the first main surface and the second main surface, the second impurity region being provided in contact with the first impurity region, the second impurity region having a second conductivity type different from the first conductivity type, a third impurity region located between the first main surface and the second main surface, the third impurity region being provided in contact with the second impurity region so as to be separated from the first impurity region, the third impurity region having the first conductivity type, a first superjunction portion having a first region and a second region, the first region being in contact with the first impurity region, the first region being located between the first impurity region and the second main surface, the first region having the first conductivity type, the second region being in contact with each of the second impurity region and the first region, the second region having the second conductivity type, a fourth impurity region located between the first main surface and the second main surface, the fourth impurity region having the first conductivity type, a fifth impurity region located between the first main surface and the second main surface, the fifth impurity region being provided in contact with the fourth impurity region, the fifth impurity region having the second conductivity type, a sixth impurity region located between the first main surface and the second main surface, the sixth impurity region being provided in contact with the fifth impurity region so as to be separated from the fourth impurity region, the sixth impurity region having the first conductivity type, and a second superjunction portion having a third region and a fourth region, the third region being in contact with the fourth impurity region, the third region being located between the fourth impurity region and the second main surface, the third region having the first conductivity type, the fourth region being in contact with each of the fifth impurity region and the third region, the fourth region having the second conductivity type, the second region has a first end surface in contact with the second impurity region, and a second end surface opposite to the first end surface, the fourth region has a third end surface in contact with the fifth impurity region, and a fourth end surface opposite to the third end surface, the first region, the second region, the fourth region, and the third region are provided side by side in a first direction parallel to the second main surface, and the second region is located between the first region and the fourth region, and the fourth region is located between the second region and the third region, and the first main surface is provided with a first trench that separates the second region and the fourth region from each other, the silicon carbide semiconductor device further comprising a first insulator provided inside the first trench, wherein a bottom surface of the first trench is located between the second end surface and the second main surface and is located between the fourth end surface and the second main surface in a direction perpendicular to the second main surface.

2. The silicon carbide semiconductor device according to claim 1, wherein an impurity concentration of each of the first region and the third region is more than or equal to $3 \times 10^{16}$ cm$^{-3}$ and less than or equal to $3 \times 10^{17}$ cm$^{-3}$.

3. The silicon carbide semiconductor device according to claim 1, wherein when it is assumed that a width of the first region is a first width and a width of the second region is a second width in the first direction and when it is assumed that an impurity concentration of the first region is a first concentration and an impurity concentration of the second region is a second concentration, a value obtained by dividing, by a value obtained by multiplying the second concentration by the second width, a value obtained by multiplying the first concentration by the first width is more than or equal to 0.5 and less than or equal to 1.5, and when it is assumed that a width of the third region is a third width and a width of the fourth region is a fourth width in the first direction and when it is assumed that an impurity concentration of the third region is a third concentration and an impurity concentration of the fourth region is a fourth concentration, a value obtained by dividing, by a value obtained by multiplying the fourth concentration by the fourth width, a value obtained by multiplying the third concentration by the third width is more than or equal to 0.5 and less than or equal to 1.5.

4. The silicon carbide semiconductor device according to claim 3, wherein each of the second width and the fourth width is more than or equal to 0.2 μm and less than or equal to 2 μm.

5. The silicon carbide semiconductor device according to claim 1, wherein a width of the first trench in the first direction is more than or equal to 0.5 μm and less than or equal to 5 μm.

6. The silicon carbide semiconductor device according to claim 1, wherein a depth of the first trench is more than or equal to 1 μm and less than or equal to 100 μm.

7. The silicon carbide semiconductor device according to claim 1, wherein a value obtained by dividing a depth of the first trench by a width of the first trench in the first direction is more than or equal to 0.5 and less than or equal to 25.

8. The silicon carbide semiconductor device according to claim 1, wherein the first trench has a first side surface and a second side surface, the first side surface being in contact with the second region, the first side surface being recessed from the second region toward the first region, the second side surface being in contact with the fourth region, the second side surface being recessed from the fourth region toward the third region.

9. The silicon carbide semiconductor device according to claim 8, wherein a value obtained by subtracting a minimum width of the first region from a maximum width of the first region in the first direction is more than or equal to 0.05 μm and less than or equal to 2.0 μm, and a value obtained by subtracting a minimum width of the third region from a maximum width of the third region in the first direction is more than or equal to 0.05 μm and less than or equal to 2.0 μm.

10. The silicon carbide semiconductor device according to claim 1, wherein the first impurity region and the first region are in one piece and the fourth impurity region and the third region are in one piece.

11. The silicon carbide semiconductor device according to claim 1, wherein the first main surface is provided with a second trench that surrounds the first trench when viewed in the direction perpendicular to the second main surface, the silicon carbide semiconductor device further comprising a second insulator provided inside the second trench.

12. A method of manufacturing a silicon carbide semiconductor device, the method comprising:

preparing a silicon carbide epitaxial substrate including a silicon carbide single crystal substrate and a silicon carbide epitaxial layer, the silicon carbide epitaxial layer being provided on the silicon carbide single crystal substrate, the silicon carbide epitaxial layer having impurity ions capable of imparting a first conductivity type;

forming a trench in the silicon carbide epitaxial layer, the trench having a first side surface and a second side surface opposite to the first side surface;

forming a second region by obliquely implanting, into the first side surface, impurity ions capable of imparting a second conductivity type; and forming a fourth region by obliquely implanting, into the second side surface, the impurity ions capable of imparting the second conductivity type, wherein the silicon carbide epitaxial layer includes a first superjunction portion and a second superjunction portion, the first superjunction portion having a first region and the second region, the first region having the first conductivity type, the first region being in contact with the second region, the second superjunction portion having a third region and the fourth region, the third region having the first conductivity type, the third region being in contact with the fourth region, and a bottom surface of the trench is located between the silicon carbide single crystal substrate and each of the second region and the fourth region in a direction perpendicular to a boundary surface between the silicon carbide single crystal substrate and the silicon carbide epitaxial layer, the method further comprising filling the trench with an insulator.

13. The method of manufacturing the silicon carbide semiconductor device according to claim 12, wherein
in each of the forming of the second region and the forming of the fourth region, the impurity ions capable of imparting the second conductivity type are implanted into the bottom surface,
the method further comprising removing, by etching, the impurity ions capable of imparting the second conductivity type and implanted in the bottom surface.

14. The method of manufacturing a silicon carbide semiconductor device according to claim 12, wherein in each of the forming of the second region and the forming of the fourth region, oblique implantation is performed to avoid the impurity ions capable of imparting the second conductivity type from being implanted into the bottom surface.

* * * * *